US009214333B1

(12) United States Patent
Sims et al.

(10) Patent No.: US 9,214,333 B1
(45) Date of Patent: Dec. 15, 2015

(54) METHODS AND APPARATUSES FOR UNIFORM REDUCTION OF THE IN-FEATURE WET ETCH RATE OF A SILICON NITRIDE FILM FORMED BY ALD

(71) Applicant: Lam Research Corporation, Fremont, CA (US)

(72) Inventors: James S. Sims, Tigard, OR (US); Kathryn M. Kelchner, Portland, OR (US); Jon Henri, West Linn, OR (US); Dennis M. Hausmann, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/494,914

(22) Filed: Sep. 24, 2014

(51) Int. Cl.
| | | |
|---|---|---|
| H01L 21/31 | (2006.01) | |
| H01L 21/02 | (2006.01) | |
| C23C 16/455 | (2006.01) | |
| C23C 16/52 | (2006.01) | |

(52) U.S. Cl.
CPC ...... *H01L 21/0217* (2013.01); *C23C 16/45536* (2013.01); *C23C 16/45544* (2013.01); *C23C 16/45557* (2013.01); *C23C 16/52* (2013.01); *H01L 21/0228* (2013.01); *H01L 21/0234* (2013.01); *H01L 21/02211* (2013.01)

(58) Field of Classification Search
CPC ....... H01L 21/306; H01L 21/20; H01L 21/31; B44C 1/22; C03C 15/00; C03C 25/06; C23C 16/48
USPC ........... 438/792, 758, 785; 427/579, 569, 578
See application file for complete search history.

(56) References Cited

U.S. PATENT DOCUMENTS

| | | | |
|---|---|---|---|
| 4,158,717 A | * | 6/1979 | Nelson .......................... 428/446 |
| 4,500,563 A | | 2/1985 | Ellenberger et al. |

(Continued)

FOREIGN PATENT DOCUMENTS

| | | |
|---|---|---|
| JP | 2010-10497 | 1/2010 |
| KR | 10-2009-0080019 | 7/2009 |

(Continued)

OTHER PUBLICATIONS

U.S. Appl. No. 14/552,245, filed Nov. 24, 2014, entitled "Method of Depositing Ammonia Free and Chlorine Free Conformal Silicon Nitride Film."

(Continued)

*Primary Examiner* — Caleb Henry
(74) *Attorney, Agent, or Firm* — Weaver Austin Villeneuve & Sampson LLP

(57) ABSTRACT

Disclosed herein are methods of depositing a SiN film having a reduced wet etch rate. The methods may include adsorbing a film precursor comprising Si onto a semiconductor substrate in a processing chamber to form an adsorption-limited layer of precursor, and then removing unadsorbed precursor from the volume surrounding the adsorbed precursor. The adsorbed precursor may then be reacted by exposing it to a plasma comprising N-containing ions and/or radicals to form a SiN film layer on the substrate, and the SiN film layer may then be densified by exposing it to a He plasma. The foregoing steps may then be repeated to form another densified SiN film layer on the substrate. Also disclosed herein are apparatuses for depositing SiN films having reduced wet etch rates on semiconductor substrates which employ the foregoing techniques.

21 Claims, 8 Drawing Sheets

(56) References Cited

U.S. PATENT DOCUMENTS

| | | | | |
|---|---|---|---|---|
| 4,575,921 A * | 3/1986 | Bhagat | | 438/303 |
| 4,869,781 A * | 9/1989 | Euen et al. | | 438/287 |
| 5,091,332 A * | 2/1992 | Bohr et al. | | 438/450 |
| 5,496,608 A | 3/1996 | Matsuda et al. | | |
| 5,670,432 A | 9/1997 | Tsai | | |
| 5,731,235 A * | 3/1998 | Srinivasan et al. | | 438/253 |
| 5,856,003 A | 1/1999 | Chiu | | |
| 6,153,519 A * | 11/2000 | Jain et al. | | 438/681 |
| 6,197,701 B1 * | 3/2001 | Shue et al. | | 438/763 |
| 6,228,779 B1 * | 5/2001 | Bloom et al. | | 438/763 |
| 6,380,056 B1 * | 4/2002 | Shue et al. | | 438/591 |
| 6,395,652 B2 * | 5/2002 | Kim et al. | | 438/792 |
| 6,428,859 B1 | 8/2002 | Chiang et al. | | |
| 6,518,167 B1 * | 2/2003 | You et al. | | 438/622 |
| 6,534,395 B2 * | 3/2003 | Werkhoven et al. | | 438/627 |
| 6,548,368 B1 * | 4/2003 | Narwankar et al. | | 438/398 |
| 6,632,478 B2 | 10/2003 | Gaillard et al. | | |
| 6,638,879 B2 * | 10/2003 | Hsieh et al. | | 438/791 |
| 6,645,574 B1 | 11/2003 | Lee et al. | | |
| 6,709,928 B1 * | 3/2004 | Jenne et al. | | 438/264 |
| 6,730,614 B1 | 5/2004 | Lim et al. | | |
| 6,794,284 B2 * | 9/2004 | Vaartstra | | 438/627 |
| 6,967,159 B2 * | 11/2005 | Vaartstra | | 438/649 |
| 7,019,159 B2 * | 3/2006 | Dussarrat et al. | | 556/410 |
| 7,041,335 B2 | 5/2006 | Chung | | |
| 7,172,792 B2 | 2/2007 | Wang et al. | | |
| 7,297,641 B2 | 11/2007 | Todd et al. | | |
| 7,300,885 B2 | 11/2007 | Hasebe et al. | | |
| 7,351,668 B2 | 4/2008 | Chou et al. | | |
| 7,462,571 B2 | 12/2008 | Hasebe et al. | | |
| 7,465,669 B2 * | 12/2008 | Iyer et al. | | 438/700 |
| 7,507,676 B2 | 3/2009 | Chou et al. | | |
| 7,510,984 B2 | 3/2009 | Saito et al. | | |
| 7,514,366 B2 * | 4/2009 | Trivedi et al. | | 438/700 |
| 7,622,369 B1 | 11/2009 | Lee et al. | | |
| 7,629,267 B2 | 12/2009 | Wan et al. | | |
| 7,651,730 B2 | 1/2010 | Hasebe | | |
| 7,651,953 B2 | 1/2010 | Todd et al. | | |
| 7,651,959 B2 | 1/2010 | Fukazawa et al. | | |
| 7,682,657 B2 | 3/2010 | Sherman | | |
| 7,713,592 B2 | 5/2010 | Nguyen et al. | | |
| 7,758,920 B2 | 7/2010 | Hasebe et al. | | |
| 7,825,039 B2 | 11/2010 | Takahashi et al. | | |
| 7,919,416 B2 | 4/2011 | Lee et al. | | |
| 7,939,455 B2 * | 5/2011 | Clark | | 438/758 |
| 7,964,241 B2 | 6/2011 | Hasebe et al. | | |
| 7,964,513 B2 | 6/2011 | Todd et al. | | |
| 7,989,365 B2 | 8/2011 | Park et al. | | |
| 8,034,673 B2 | 10/2011 | Kadonaga et al. | | |
| 8,080,290 B2 | 12/2011 | Hasebe et al. | | |
| 8,119,544 B2 | 2/2012 | Hasebe et al. | | |
| 8,178,448 B2 | 5/2012 | Nodera et al. | | |
| 8,227,032 B2 | 7/2012 | Dussarrat et al. | | |
| 8,257,789 B2 | 9/2012 | Matsunaga et al. | | |
| 8,366,953 B2 | 2/2013 | Kohno et al. | | |
| 8,383,525 B2 | 2/2013 | Raisanen et al. | | |
| 8,394,466 B2 | 3/2013 | Hong et al. | | |
| 8,592,328 B2 | 11/2013 | Hausmann et al. | | |
| 8,753,984 B2 * | 6/2014 | Murakami et al. | | 438/765 |
| 8,791,034 B2 * | 7/2014 | Shealy et al. | | 438/791 |
| 2003/0143841 A1 * | 7/2003 | Yang et al. | | 438/656 |
| 2004/0043570 A1 * | 3/2004 | Fujisaki et al. | | 438/287 |
| 2005/0042865 A1 * | 2/2005 | Cabral et al. | | 438/680 |
| 2005/0109276 A1 | 5/2005 | Iyer et al. | | |
| 2005/0118837 A1 | 6/2005 | Todd et al. | | |
| 2005/0159017 A1 | 7/2005 | Kim et al. | | |
| 2005/0196977 A1 | 9/2005 | Saito et al. | | |
| 2005/0287309 A1 * | 12/2005 | Veerasamy | | 427/595 |
| 2005/0287775 A1 | 12/2005 | Hasebe et al. | | |
| 2006/0008656 A1 * | 1/2006 | Veerasamy | | 428/434 |
| 2006/0084283 A1 | 4/2006 | Paranjpe et al. | | |
| 2006/0088985 A1 | 4/2006 | Haverkort et al. | | |
| 2006/0199357 A1 | 9/2006 | Wan et al. | | |
| 2006/0286776 A1 | 12/2006 | Ranish et al. | | |
| 2007/0137572 A1 | 6/2007 | Matsuura et al. | | |
| 2007/0167028 A1 | 7/2007 | Chou et al. | | |
| 2007/0251444 A1 | 11/2007 | Gros et al. | | |
| 2008/0038936 A1 | 2/2008 | Todd et al. | | |
| 2008/0063791 A1 | 3/2008 | Hasebe et al. | | |
| 2008/0081470 A1 * | 4/2008 | Clark | | 438/680 |
| 2008/0119057 A1 * | 5/2008 | Chua et al. | | 438/763 |
| 2008/0124946 A1 | 5/2008 | Xiao et al. | | |
| 2008/0139003 A1 | 6/2008 | Pirzada et al. | | |
| 2008/0213479 A1 | 9/2008 | Chou et al. | | |
| 2008/0274302 A1 | 11/2008 | Hasebe et al. | | |
| 2008/0311760 A1 | 12/2008 | Nodera et al. | | |
| 2008/0318443 A1 * | 12/2008 | Kim et al. | | 438/785 |
| 2009/0018668 A1 | 1/2009 | Galbraith | | |
| 2009/0075490 A1 | 3/2009 | Dussarrat | | |
| 2009/0148625 A1 | 6/2009 | Yeom et al. | | |
| 2009/0155606 A1 | 6/2009 | Yoon et al. | | |
| 2009/0191722 A1 | 7/2009 | Hasebe et al. | | |
| 2010/0124621 A1 | 5/2010 | Kobayashi et al. | | |
| 2010/0136260 A1 | 6/2010 | Matsunaga et al. | | |
| 2010/0136313 A1 | 6/2010 | Shimizu et al. | | |
| 2010/0151681 A1 * | 6/2010 | Knapp et al. | | 438/680 |
| 2010/0221925 A1 | 9/2010 | Lee et al. | | |
| 2010/0304574 A1 | 12/2010 | Nodera et al. | | |
| 2010/0310791 A1 | 12/2010 | Shimazu et al. | | |
| 2011/0003477 A1 * | 1/2011 | Park et al. | | 438/680 |
| 2011/0014795 A1 | 1/2011 | Lee et al. | | |
| 2011/0086516 A1 | 4/2011 | Lee et al. | | |
| 2011/0151142 A1 | 6/2011 | Seamons et al. | | |
| 2011/0256734 A1 | 10/2011 | Hausmann et al. | | |
| 2012/0009803 A1 | 1/2012 | Jung et al. | | |
| 2012/0028469 A1 | 2/2012 | Onizawa et al. | | |
| 2012/0058282 A1 | 3/2012 | Hong et al. | | |
| 2012/0108079 A1 | 5/2012 | Mahajani | | |
| 2012/0177841 A1 | 7/2012 | Thompson | | |
| 2012/0213940 A1 | 8/2012 | Mallick | | |
| 2012/0282418 A1 | 11/2012 | Chou et al. | | |
| 2012/0315394 A1 | 12/2012 | Ito | | |
| 2013/0071580 A1 | 3/2013 | Weidman et al. | | |
| 2013/0115783 A1 | 5/2013 | Kim et al. | | |
| 2013/0189854 A1 | 7/2013 | Hausmann et al. | | |
| 2014/0141626 A1 | 5/2014 | Hausmann et al. | | |
| 2014/0193983 A1 | 7/2014 | LaVoie | | |

FOREIGN PATENT DOCUMENTS

| | | |
|---|---|---|
| WO | WO 2006/026350 | 3/2006 |
| WO | WO 2011/130397 | 10/2011 |

OTHER PUBLICATIONS

U.S. Appl. No. 14/552,011, filed Nov. 24, 2014, entitled "Selective Inhibition in Atomic Layer Deposition of Silicon-Containing Films."

US Office Action dated Sep. 14, 2012 issued in U.S. Appl. No. 13/084,305.

US Final Office Action dated Apr. 25, 2013 issued in U.S. Appl. No. 13/084,305.

US Office Action dated Jun. 7, 2013 issued U.S. Appl. No. 13/414,619.

US Notice of Allowance dated Jul. 26, 2013, issued U.S. Appl. No. 13/414,619.

US Office Action dated Apr. 11, 2014 issued in U.S. Appl. No. 14/065,334.

US Final Office Action dated Nov. 14, 2014 issued in U.S. Appl. No. 14/065,334.

US Notice of Allowance dated Feb. 17, 2015 issued in U.S. Appl. No. 14/065,334.

PCT Invitation to Pay Additional Fees; Communication Re Partial International Search, dated Dec. 16, 2011, issued in PCT/US2011/032303.

PCT International Search Report and Written Opinion, dated Feb. 20, 2012, issued in PCT/US2011/032303.

PCT International Preliminary Report on Patentability and Written Opinion, dated Oct. 26, 2012, issued in PCT/US2011/032303.

European Extended Search Report dated Apr. 14, 2014 issued in EP 13 15 2046.

Korean Notice of Provisional Rejection dated Dec. 6, 2013 issued in KR 10-2012-0043797.

(56) References Cited

OTHER PUBLICATIONS

Korean Final Office Action dated Aug. 18, 2014 issued in KR 10-2012-0043797.
Cecchi et al., (2007) "Ultra-thin conformal pore-sealing of low-k materials by plasma-assisted ALD," University of New Mexico, Albuquerque, NM, Sandia National Labs, Albuquerque, NM, 1 page.
King, Sean W., (Jul./Aug. 2011) "Plasma enhanced atomic layer deposition of SiNx:H and SiO2," J. Vac. Sci. Technol. A29(4):041501-1 through 041501-9 (9 pages).
Plasma Enhanced Atomic Layer Deposition (PEALD), Website: http://www.asm.com/index.php?option=com_content&task=view&id=19&Itemid=161 (2010), 1 page.
"PlasmaPro™ NGP® 80 Range," *Oxford Instruments* (2010), 8 pages.

\* cited by examiner

440 C wafer temperature — As-deposited — Post 60 sec. HF dip

520 C wafer temperature — As-deposited — Post 60 sec. HF dip

METHODS AND APPARATUSES FOR UNIFORM REDUCTION OF THE IN-FEATURE WET ETCH RATE OF A SILICON NITRIDE FILM FORMED BY ALD

BACKGROUND

As device and features size continue to shrink in the semiconductor industry, and also as 3D device structures (e.g., Intel's Tri-Gate transistor architecture) become more prevalent in integrated circuit (IC) design, the capability of depositing thin conformal films (films of material having a uniform thickness relative to the shape of the underlying structure, even if non-planar) will continue to gain importance. Atomic layer deposition (ALD) is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying device structure.

Silicon nitride (SiN) films are one important variety of dielectric film which may be formed via ALD in the fabrication of modern transistor designs. Due to the role of SiN films in these architectures, it is often desirable for SiN films to have a low wet etch rate. Yet, the formation of such etch-resistant SiN films via ALD processes has been difficult to achieve within typical thermal budget constraints. Hence what is sought are improved methods and apparatus for forming such films.

SUMMARY

Disclosed herein are methods of depositing a SiN film having a reduced wet etch rate on a semiconductor substrate in a processing chamber. The methods may include adsorbing a film precursor onto a semiconductor substrate in a processing chamber such that the film precursor forms an adsorption-limited layer on the substrate, the film precursor comprising Si, and then removing at least some unadsorbed film precursor from the volume surrounding the adsorbed film precursor. After the removal of unadsorbed precursor, the adsorbed film precursor may then be reacted by exposing it to a plasma comprising N-containing ions and/or radicals to form a SiN film layer on the substrate. Thereafter, the methods may further include densifying the SiN film layer by exposing it to a He plasma for between 0.5 and 15 seconds. The He plasma may have a power density relative to the substrate surface of between about 0.035 and 2.2 W/cm$^2$. The foregoing steps may then be repeated to form another densified SiN film layer on the substrate.

Also disclosed herein are apparatuses for depositing SiN films having reduced wet etch rates on semiconductor substrates. The apparatuses may include a processing chamber, a substrate holder in the processing chamber, one or more gas inlets for flowing gases into the processing chamber, a vacuum source for removing gases from the processing chamber, and a plasma generator for generating plasmas within the processing chamber. The apparatuses may further include one or more controllers comprising machine-readable instructions for operating the one or more gas inlets, vacuum source, and plasma generator to deposit SiN film layers onto the substrates. These instructions may include: instructions for operating the one or more gas inlets to flow a film precursor into the processing chamber and adsorbing the film precursor onto a semiconductor substrate held in the substrate holder such that the film precursor forms an adsorption-limited layer on the substrate, the film precursor comprising Si; instructions for operating the vacuum source to remove at least some unadsorbed film precursor from the volume surrounding the adsorbed film precursor; instructions, to be executed after removing unadsorbed film precursor, for operating the plasma generator to generate a plasma comprising N-containing ions and/or radicals, and reacting the adsorbed film precursor by exposing it to said plasma to form a SiN film layer on the substrate; and instructions, to be executed after reacting the adsorbed precursor, for operating the plasma generator to generate a plasma comprising He having a power density relative to the substrate surface of between about 0.035 and 2.2 W/cm$^2$, and densifying the SiN film layer by exposing it to said plasma for between 0.5 and 15 seconds. The instructions may further include repeating the foregoing instructions to form another densified SiN film layer on the substrate.

DETAILED DESCRIPTION

In the following description, numerous specific details are set forth in order to provide a thorough understanding of the present invention. However, the present invention may be practiced without some or all of these specific details. In other instances, well known process operations or hardware have not been described in detail so as to not unnecessarily obscure the inventive aspects of the present work. While the invention will be described in conjunction with specific detailed embodiments, it is to be understood that these specific detailed embodiments are not intended to limit the scope of the inventive concepts disclosed herein.

Figure 1A:
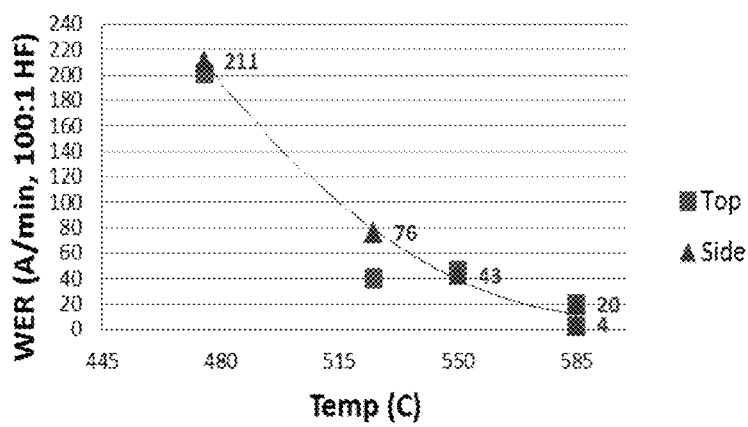
FIG. 1A presents data for SiN films showing the dependency of each film's wet etch rate on deposition temperature.
Figures 1B, 1C:
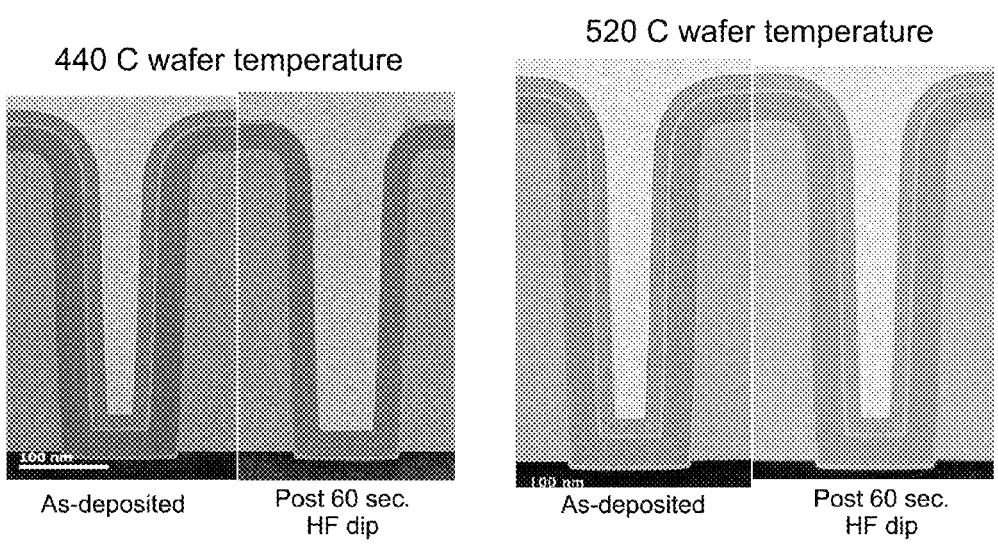
FIG. 1B presents transmission electron microscope images of a substrate feature with a SiN film deposited at 440 C before and after wet etch.
FIG. 1C presents transmission electron microscope images of a substrate feature with a SiN film deposited at 520 C before and after wet etch.

Conformal SiN is traditionally deposited in large furnaces at high temperatures which produces suitably etch-resistant SiN films. With the requirement to reduce deposition temperatures in the fabrication of next-generation devices, furnace-based thermal deposition methods fail to meet projected performance requirements. However, while plasma-activated ALD processes have the capability of producing wet etch-resistant SiN films at certain elevated temperatures, when lower temperatures are employed—without special procedures/process modifications—the resulting films suffer from high wet etch rates—and typically non-uniform wet etch rates when high aspect ratio devices structures are considered. The increase in wet etch rates (WERs) of ALD-formed SiN films as deposition temperature is lowered is illustrated by the data shown in FIG. 1A. Data corresponding to SiN films on both the sidewall and top region of a substrate feature are shown and both show roughly the same undesirable increase in WER as temperature is lowered. Transmission electron microscope (TEM) images of a substrate feature having a SiN film formed with a 440° C. ALD process before and after wet etch are shown in FIG. 1B. The images show a substantial etching away of the SiN film formed at the 440° C. process temperature. In contrast, etch resistant at a higher deposition temperature of 520° C. is illustrated by the TEM images in FIG. 1C which display a SiN film formed at the higher process temperature appearing nearly the same before and after wet etch.

In some circumstances, techniques other than high process temperature may be used to achieve low WERs in ALD-formed SiN films. For instance, in some cases low WERs may be achieved by using doping and/or annealing procedures. However, doping is generally not compatible with common process flows which subject the substrate to oxidizing plasma—the oxidizing plasma tends to remove and/or alter the dopants. Likewise, annealing is typically not acceptable due to the aforementioned thermal budget limitations associated with the fabrication of current and next-generation architectures.

Accordingly, alternative low-temperature ALD processes have been sought to produce etch-resistant conformal SiN films. Such processes typically involve one or more modifications to the basic ALD process sequence.

A semiconductor fabrication step employing the ALD technique to form a film of material typically employs multiple sequential cycles of ALD. A single cycle of ALD only deposits a thin film of material (oftentimes only one molecular layer thick). To build up a film of an appreciable desired thickness, multiple ALD cycles can be performed. Hence there exists the concept of an "ALD cycle" which is sequentially repeated.

Baseline ALD Cycle

In brief, a basic "ALD cycle" for forming a single layer of SiN film on a substrate may include the following steps: (i) film precursor dosing/adsorption, (ii) post-dose removal of unadsorbed precursor, (iii) plasma-activated reaction/conversion of adsorbed precursor, and optionally, (iv) post-reaction removal of desorbed precursor and/or reaction by-product. Operations (i)-(iii)—and in some embodiments also (iv)—therefore constitute a single cycle of ALD which may then be repeated one or more times to deposit additional layers of film on the substrate, and to thereby build up a film of appreciable thickness as desired.

Figure 2:
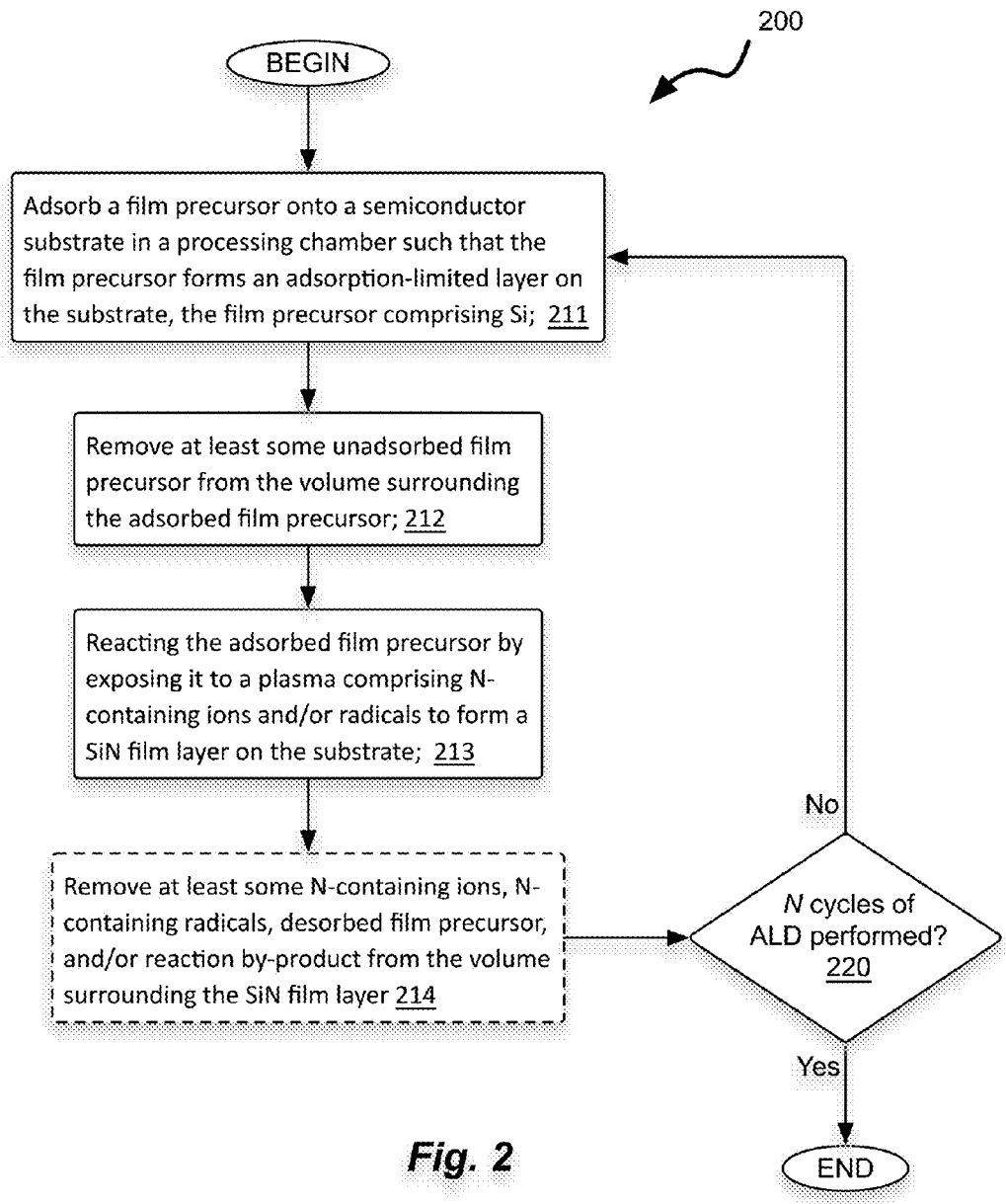
FIG. 2 is a flowchart of a baseline atomic layer deposition process for forming SiN films.

In greater depth, such a basic ALD process sequence for SiN deposition is schematically illustrated in by the flowchart of FIG. 2. As shown in the figure, a single ALD cycle may begin with an operation 211 of adsorbing a film precursor onto a semiconductor substrate in a processing chamber such that the film precursor forms an adsorption-limited layer on the substrate. For deposition of a SiN film, the film precursor typically contains Si, and thus acts as the Si source for the growing SiN film. The absorption/dose operation is followed by an operation 212 of removing at least some unadsorbed film precursor from the volume surrounding the adsorbed film precursor. Thereafter, in operation 213, the adsorbed film precursor is reacted by exposing it to a plasma comprising N-containing ions and/or radicals. This then results in the formation of a SiN film layer on the substrate. Finally, in some embodiments (as indicated by the dashed-line-drawn box in FIG. 2) and depending on the chemistry of the film-forming reaction, operation 213 may be followed by an operation 214 to remove at least some N-containing ions, N-containing radicals, desorbed film precursor, and/or reaction by-product from the volume surrounding the SiN film layer.

The foregoing sequence of operations 211 through 214 represent a single ALD cycle resulting in the formation of a single layer of SiN film. However, since a single layer of film formed via ALD is typically very thin—often it is only a single molecule thick—multiple ALD cycles are repeated in sequence to build up a SiN film of appreciable thickness. Thus, referring again to FIG. 2, if it is desired that a film of say N layers be deposited (or, equivalently, one might say N layers of film), then multiple ALD cycles (operations 211 to 214) are repeated in sequence, and after each ALD cycle concludes with operation 214, in operation 220, it is determined whether N cycles of ALD have been performed. Then, if N cycles have been performed, the film-forming operations conclude, whereas if not, the process sequence returns to operation 211 to begin another cycle of ALD. In so doing, a conformal film of the desired thickness may be deposited.

During step (i) of the ALD cycle just described—i.e., film precursor dosing/adsorption—silicon-containing film precursor may be flowed to the reaction chamber at a rate of between about 1 and 5 sL/m (standard liters per minute), or more particularly between about 3 and 5 sL/m, or still more particularly between about 4 and 5 sL/m, or about 4.5 sL/m. These values correspond to a 4 station reaction chamber designed to handle 300 mm diameter wafers. Flow rates would be adjusted proportionally for reaction chambers with greater or fewer numbers of stations, or for larger or smaller diameter wafers. Of course, even for a fixed number of stations and wafer size, the volume of the reaction chamber also influences the choice of flow rate. Thus, depending on the embodiment, silicon-containing film precursor may be flowed to the reaction chamber such that the precursor has a partial pressure in the chamber of between about 1 and 50 torr, or more particularly between about 10 and 20 torr, or in some embodiments, between about 8 and 12 torr, or about 10 torr. The duration of the flow may be for between about 1 and 15 seconds, or more particularly between about 1 and 5 seconds, or yet more particularly between about 2 and 3 seconds, or for about 2.5 seconds.

Depending on the embodiment, the film precursor adsorbed onto the substrate during step (i), in addition to containing silicon, may include one or more halogens, or two or more halogens (see the description of halosilanes below). Examples of the latter include dichlorosilane, hexachlorodisilane, tetrachlorosilane. In some embodiments, the silicon-containing film precursor adsorbed during step (i) may be selected from the aminosilanes.

During step (ii) of the ALD cycle just described—i.e., the post-dose removal of unadsorbed precursor—the purge may employ an inert purge gas (such as $N_2$ or Ar) flowed to the reaction chamber at a rate of between about 10 and 40 sL/m for between 1 and 10 seconds, or more particularly for between about 1 and 3 seconds, or for about 2 seconds. Again, these values correspond to a 4 station reaction chamber designed to handle 300 mm diameter wafers. Flow rates would again be adjusted proportionally for reaction chambers with greater or fewer numbers of stations, or for larger or smaller diameter wafers. In some embodiments, this purge may be followed by a pump-to-base (PTB)—i.e., pumping the chamber down to a base pressure, typically as low as is reasonably feasible to achieve. The PTB may be accomplished by directly exposing the reaction chamber to one or more vacuum pumps. In some embodiments, the base pressure may typically be only a few milliTorr (e.g., between about 1 and 20 mTorr).

During step (iii) of the ALD cycle just described—i.e., the plasma-activated reaction/conversion of adsorbed precursor—a plasma is generated which includes N-containing ions and/or radicals to which the adsorbed silicon-containing film precursor is exposed resulting in the surface reaction forming a layer of SiN film. The plasma is formed by applying RF electromagnetic (EM) radiation to a nitrogen-containing plasma precursor, which may be ammonia ($NH_3$), molecular nitrogen gas ($N_2$), an amine such as t-butyl amine, or a combination of the foregoing.

However, in some embodiments, prior to generating the N-containing plasma, a pre-flow of the N-containing plasma precursor (e.g., $NH_3$) is established for between about 0.5 and 10 seconds, or more particularly for between about 4 and 8 seconds, or for about 6 seconds. The flow rate may be between about 1 and 10 sL/m, or more particularly between about 4 and 6 sL/m, or about 3 sL/m, however, again, these values correspond to a chamber with 4 stations for handling 300 mm wafers, and so, depending on the embodiment, the N-containing plasma precursor may be flowed to the reaction chamber in a manner so as to establish a partial pressure of the plasma precursor of between about 1.5 and 6 torr, or more particularly between about 1.5 and 3 torr, or about 2 torr.

Still referring to step (iii), after the pre-flow, RF power is switched on to generate the plasma having N-containing ions and/or radicals. Viable flows and partial pressures for the plasma precursor during plasma generation may be the same as those just described for pre-flow. RF power for generating the plasma may be between about 100 and 6000 W, or more particularly between about 400 and 5100 W, or yet more particularly between about 900 and 4100 W, or still yet more particularly between about 2500 and 3500, or about 3000 with a frequency of 13.56 MHz (although positive integer multiples of 13.56 MHz such as 27.12 MHz, 40.68 MHz, or 54.24 MHz, and so forth may also be used depending on the embodiment, and some frequency tuning about 13.56 MHz or the multiple thereof may also be employed as described in further detail below). The RF power may remain switched on for between about 0.1 and 6 seconds resulting in a corresponding exposure time of the adsorbed silicon-containing film precursor to N-containing ions and/or radicals of the plasma for between about 0.1 and 6 seconds causing the SiN film forming surface reaction. More particularly, RF power may be switched on (and the absorbed film precursor exposed to the plasma) for between about 0.5 and 3 seconds, or for between about 0.5 and 2 seconds, or for between about 1 and 2 seconds. Once again, it should be understood that these plasma powers correspond to a chamber having 4 process stations for handling 300 mm diameter wafers. As such, appropriate plasma power densities for step (iii) may be between about 0.035 and 2.2 $W/cm^2$ (since, $0.035 \approx 100/(4*\pi*15^2)$ and $2.2 \approx 6000/(4*\pi*15^2)$), and similarly for the other plasma power values and ranges stated above.

In some embodiments, there has been found to be a tradeoff between plasma exposure time and plasma power—i.e., short exposure time works well with high plasma power, long exposure time works well with low plasma power, and intermediate exposure time works well with intermediate plasma power.

As for optional step (iv) of the ALD cycle just described—post-reaction removal of desorbed precursor and/or reaction by-product—removal may be accomplished by purging the chamber with an inert purge gas (e.g., Ar or $N_2$) at a flow rate of between about 10 and 40 sL/m for between 1 and 10 seconds, or more particularly for between about 1 and 3 seconds, or for about 2 seconds. Once again, the flow rates correspond to a chamber with 4 stations for handling 300 mm diameter wafers and so would be adjusted proportionally for larger or smaller chambers handling greater or fewer numbers of wafers of larger or smaller diameters. In terms of pressure, pressure within the chamber during the purge may be between about 2 and 10 torr, or more particularly between about 4 and 8 torr, or about 6 torr. As with removal step (ii), in some embodiments, a PTB may also be employed during step (iv) to facilitate removal.

Thus, the removing in operations (ii) and (iv) may be done generally via purging, evacuating by pumping down to a base pressure ("pump-to-base"), etc. the volume surrounding the substrate. In some embodiments, these purges may be logically divided into what is referred to herein as a "primary purge" or "burst purge" and a "secondary purge." (The use of primary/burst and secondary purges are described in detail in U.S. patent application Ser. No. 14/447,203 filed Jul. 30, 2014, titled "METHODS AND APPARATUSES FOR SHOWERHEAD BACKSIDE PARASITIC PLASMA SUPPRESSION IN A SECONDARY PURGE ENABLED ALD SYSTEM," which is incorporated by reference herein in its entirety for all purposes.)

Modified ALD Cycle

As indicated above, various modifications to the basic ALD cycle sequence are sought to attempt to increase the etch-resistance of an ALD formed SiN film. In one technique, a pulsed plasma mode (a pulsed RF field is used to support the plasma) may be used in the plasma activated reaction/conversion step (step (iii) above) leading to densification of the SiN film as it is deposited, lowering its wet etch rate. (Densification and how it relates to wet etch rate is described in further detail below but, in short, a dense SiN film tends to be more etch-resistant.) This pulsed plasma mode is described in detail in U.S. patent application Ser. No. 14/144,107 (US Pat. Pub. No. 2014/0113457), filed Dec. 30, 2013, and titled "Plasma enhanced atomic layer deposition with pulsed plasma exposure," which is hereby incorporated by reference in its entirety for all purposes.

In another technique, an argon plasma treatment step may be inserted into the ALD cycle after the post-dose removal step (step (ii) above) but before the plasma activated reaction step (step (iii)). The Ar plasma treatment includes flowing Ar to the chamber, applying an RF field to generate an Ar plasma, and subsequent to Ar plasma exposure, removing the Ar gas from the process chamber. Again, this is concluded prior to the plasma activated reaction/conversion step (iii) (which involves a different plasma, as detailed above). Inserted at this state of the ALD cycle, the Ar plasma treatment promotes Si—Si bonding thus densifying the SiN film.

In yet another technique, a hybrid approach, based on ALD, but employing a CVD (chemical vapor deposition) phase at the tail end of the precursor adsorption/dose step (step (i) above) may be used to densify the film. This may be implemented by applying RF radiation for a short duration to the gas phase of the film precursor being dosed before the unadsorbed gas-phase precursor is removed from the processing chamber in the next step (step (iii) above). (In typical ALD, only the adsorbed film precursor is left in the processing chamber when the conversion reaction is plasma activated.) This also results in densification of the deposited SiN film by promoting Si incorporation into the film via the gas-phase CVD reactions.

Finally, a fourth technique designed to densify the SiN film as it is deposited employs a helium plasma treatment which, as described in greater detail below, is added as an additional step (v) which densifies the deposited layer of SiN film after the reactive conversion step (iii) and optional removal step (iv). It has been discovered that this fourth technique which involves periodic He plasma treatments as an additional step (v) during the ALD cycles can—under the right process conditions to be described in greater detail below—result in lower wet etch rates of blanked SiN films and, importantly, lower wet etch rates on all sides of a patterned substrate feature. Moreover, it has been discovered that this modified ALD technique has the ability to achieve these substantially uniform wet etch rates (on feature tops and bottoms versus sidewalls) at lower deposition temperatures than previously thought possible.

Without being limited to a particular theory, it is thought that vacuum ultraviolet (VUV) radiation emitted by excited state helium in the plasma is responsible for the wet etch rate (WER) reducing effect of the He plasma treatment step of this modified ALD cycle. Experiments have shown that WER is closely tied to the density of hydrogen in a deposited SiN film—which is typically present by virtue of N—H bonds leftover from the original reactive species used as the source of nitrogen for the SiN film. It is thought that VUV radiation emitted from the He plasma breaks these N—H bonds resulting in their replacement with N—Si bonds, densifying the SiN film and making it more etch resistant. In addition, and again without being limited to a particular theory, it is thought that the relatively long lifetime of excited state He species provides sufficient time for these species to diffuse down into high aspect ratio 3D structures prior to their VUV emission (and decay to their ground states) thus driving the N—H bond conversion to N—Si bonds (and film densification) substantially uniformly over the entire surfaces of high aspect ratio features—including the feature's sidewalls and top regions.

Referring now again to the specifics of the modified ALD cycle, note that to complete the ALD cycle, the foregoing densification step (v) involving treatment with He plasma may optionally be followed by a step (vi) of removing He gas from the volume surrounding the now densified SiN film layer.

Figure 3:
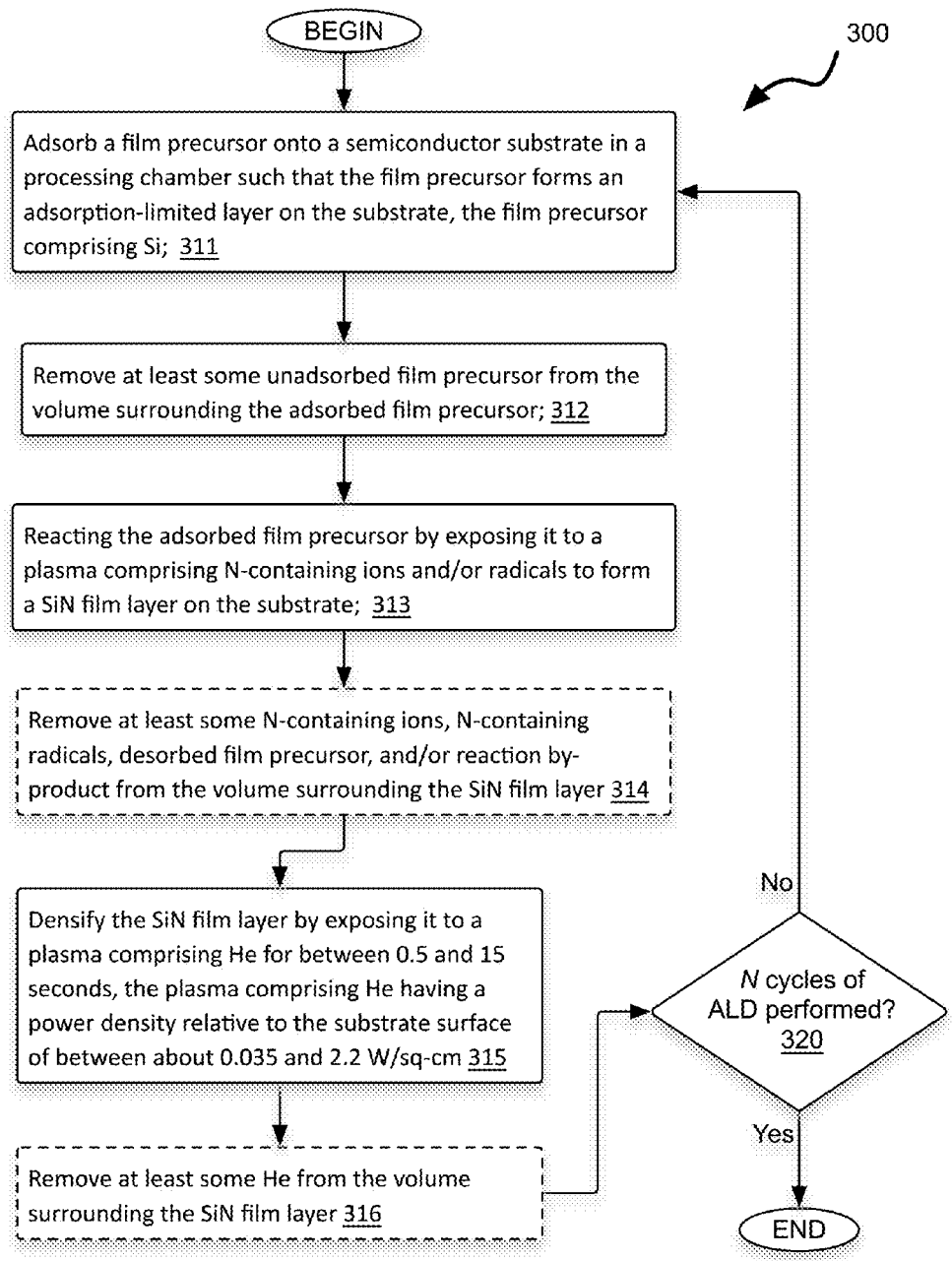
FIG. 3 is a flowchart of a modified atomic layer deposition process employing a helium plasma treatment as an additional step of the ALD cycle.

FIG. 3 presents an example of this modified ALD technique in detail. As shown in the FIG. 3, this modified ALD process sequence 300 involving densification via He plasma treatment begins in a matter similar to the basic ALD process sequence 200 shown in FIG. 2 (i.e., operations 311, 312, 313, and 314 correspond, respectively, to operations 211, 212, 213, and 214 from the basic process 200 shown in FIG. 2). However, after operation 214/314 (assuming optional operation 214/314 is employed) the processes diverge. That is, the modified ALD process shown in FIG. 3 at this point employs an operation 315 of densifying the SiN film layer by exposing it to a plasma comprising He. In this particular embodiment, the plasma exposure has a duration of between 0.5 and 15 seconds. In addition, in this particular embodiment, a He plasma is used having a power density relative to the substrate surface of between about 0.035 and 2.2 W/cm$^2$ as indicated in the figure. Other ranges of plasma exposure times/durations and plasma power densities are described in greater detail below. After the densification operation 315, an operation 316 of removing at least some He from the volume surrounding the SiN film layer may be performed (again, optional, as indicated by the dashed-line-drawn box in FIG. 2). Thus, operations 311-316 constitute a single ALD cycle in this modified scheme, and multiple ALD cycles may be used to deposit additional SiN layers to build up a film of appreciable thickness. Thus, similar to FIG. 2, if it is desired that a film of say N SiN layers be deposited (or, equivalently, one might say N layers of SiN film), multiple ALD cycles (operations 311 to 316) are repeated in sequence, and after each ALD cycle concludes with operation 316, in operation 320, it is determined whether N cycles of ALD have been performed. Then, if N cycles have been performed, the SiN film-forming operations conclude, whereas if not, the process sequence returns to operation 311 to begin another cycle of ALD.

During step (v) of the ALD cycle just described (also referred to as operation 315 in FIG. 3)—i.e., densifying the deposited SiN film layer by exposing it to a plasma comprising He—a He-containing plasma is generated to which the deposited SiN film layer is exposed resulting in the densification of the deposited layer of SiN film. The plasma is formed by applying RF electromagnetic (EM) radiation to He gas (or He mixed with another gas, such as an inert gas).

However, in some embodiments, prior to generating the He plasma, a pre-flow of He gas (or He mixed with another gas, such as an inert gas) is established for between about 0.5 and 15 seconds, or more particularly for between about 2 and 8 seconds, or for about 5 seconds. The flow rate may be between about 1 and 10 sL/m, or more particularly between about 4 and 6 sL/m, or about 5 sL/m, however, again, these values correspond to a chamber with 4 stations for handling 300 mm wafers, and so, depending on the embodiment, He gas may be flowed to the reaction chamber in a manner so as to establish a partial pressure of He in the processing chamber of between about 2 and 6 torr, or more particularly between about 3 and 5 torr, or about 4 torr.

Still referring to step (v), after the He pre-flow, RF power is switched on to generate the He plasma for densifying the layer of SiN film. Viable flows and partial pressures for He gas during plasma generation may be the same as those just described for pre-flow. RF power for generating the plasma may be between about 100 and 6000 W, or more particularly between about 400 and 5100 W, or yet more particularly between about 900 and 4100 W, with a frequency of 13.56 MHz (although positive integer multiples of 13.56 MHz such as 27.12 MHz, 40.68 MHz, or 54.24 MHz, and so forth may also be used depending on the embodiment, and some frequency tuning about 13.56 MHz or the multiple thereof may also be employed as described in further detail below). The RF power may remain switched on for between about 0.5 and 15 seconds resulting in a corresponding exposure time of the deposited SiN film layer to densify it. Once again, it should be understood that these plasma powers correspond to a chamber having 4 process stations for handling 300 mm diameter wafers. As such, appropriate plasma power densities for step (v) may be between about 0.035 and 2.2 W/cm$^2$ (since, $0.035 \approx 100/(4*\pi*15^2)$ and $2.2 \approx 6000/(4*\pi*15^2)$), and similarly for the other plasma power values and ranges stated above.

As with the reactive conversion step (iii), in some embodiments, there has been found to be a tradeoff between plasma exposure time and plasma power—i.e., short exposure time works well with high plasma power, long exposure time works well with low plasma power, and intermediate exposure time works well with intermediate plasma power. For example, in some lower plasma power embodiments, the plasma comprising He to which the SiN layer is exposed in step (v) may have a power density of between about 0.070 and 0.28 W/cm$^2$, and the plasma exposure time of the deposited SiN film layer to said plasma for densification may be for between about 4 and 8 seconds. (Note $0.070 \approx 200/(4*\pi*15^2)$ and $0.28 \approx 800/(4*\pi*15^2)$, so this is a relative low wattage range of 200-800 W.) Likewise, in some higher plasma power embodiments, the plasma comprising He to which the SiN layer is exposed in step (v) may have a power density of between about 0.88 and 1.2 W/cm$^2$, and the plasma exposure time of the deposited SiN film layer to said plasma for densification may be for between about 0.5 and 2 seconds. (Note $0.88 \approx 2500/(4*\pi*^2)$ and $1.2 \approx 3500/(4*\pi*15^2)$, so this is a relative low wattage range of 2500-3500 W.) Finally, in an intermediate plasma power embodiment, the plasma comprising He to which the SiN layer is exposed in step (v) may have a power density of between about 0.28 and 0.88 W/cm$^2$, and the plasma exposure time of the deposited SiN film layer to said plasma for densification may be for between about 2 and 4 seconds. (Note $0.28 \approx 800/(4*\pi*15^2)$ and $0.88 \approx 2500/(4*\pi*15^2)$, so this is a relative low wattage range of 800-2500 W.)

In some embodiments, it has been found that using the same or lower plasma power density for the He plasma in densification step (v) relative to the power density used in reactive conversion step (iii) works well and leads to films with low wet etch rates (WERs). (See the examples below.) Thus, in some embodiments, the ratio of the power density of the He plasma in step (v) to the power density of the plasma comprising N-containing ions and/or radicals in step (iii) may be less than 1, or more particularly between about 0.1 and 0.9, or yet more particularly between about 0.1 and 0.5, or still yet more particularly between about 0.1 and 0.3. See, for example, FIGS. 4C and 4D discussed below. Likewise, it has also been found that, in some embodiments, using the same or longer plasma exposure times in step (v) versus step (iii) works well for generating SiN films with low WERs. Thus, in some embodiments, the ratio of plasma exposure time in step (v) to the plasma exposure time in step (iii) may be greater than 1, or more particularly between about 1 and 10, or yet more particularly between about 2 and 8, or yet still more particularly between about 5 and 7. See again, for example, FIGS. 4C and 4D discussed below. Furthermore, in some embodiments, the substrate exposure time to the plasma comprising N-containing ions and/or radicals in step (iii) may be less than 2 seconds, or more particularly less than about 1 second.

As for optional step (vi) of the ALD cycle just described—removing He gas from the volume surrounding the densified SiN film layer—removal may again be accomplished by purging the chamber with an inert purge gas (e.g., Ar or N$_2$) at a flow rate of between about 10 and 40 sL/m for between 1 and 10 seconds, or more particularly for between about 1 and 3 seconds, or for about 2 seconds. Once again, the flow rates correspond to a chamber with 4 stations for handling 300 mm diameter wafers and so would be adjusted proportionally for larger or smaller chambers handling greater or fewer numbers of wafers of larger or smaller diameters. In terms of pressure, pressure within the chamber during the purge may be between about 5 and 15 torr, or more particularly between about 8 and 12 torr, or about 10 torr. As with removal steps (ii) and (iv), in some embodiments, a PTB may also be employed during step (vi) to facilitate removal.

SiN films deposited using the sequence of operations presented in FIG. 3—employing a modified ALD process which incorporates a He plasma treatment—have been found to exhibit good wet etch-resistance, even when formed at lower temperatures. For instance, in some embodiments, SiN films having reduced wet-etch rates may be formed by employing the foregoing described processes while maintaining temperature in the processing chamber (e.g., during operations 311-316) about or below 550° C., or about or below 525° C., or about or below 500° C., or about or below 485° C., or even about or below 475° C. SiN films deposited with these processes in the foregoing reduced temperature regimes may exhibit wet etch rates about or below 100 Å/minute, or about or below 75 Å/minute, or about or below 50 Å/minute, or even about or below 25 Å/minute when exposed to a 100:1 molar ratio HF solution at 23° C. and 760 torr.

Moreover, when these techniques are used to deposit SiN films onto semiconductor substrates having high aspect ratio features, it is observed that the reduction in wet etch rate is maintained both on the top regions and on the sidewalls of such features, depending on the particular process conditions chosen for the SiN deposition. Again, depending on the embodiment, substantially uniform wet etch rates (considering top regions, bottom regions, and sidewalls) may be observed as low as about or below 100 Å/minute, or about or below 75 Å/minute, or about or below 50 Å/minute, or even about or below 25 Å/minute when exposed to a 100:1 molar ratio HF solution at 23° C. and 760 torr. Such low temperature deposition of wet etch-resistant SiN is illustrated by the following examples for various choices of process parameters.

EXAMPLES

Figure 4A:
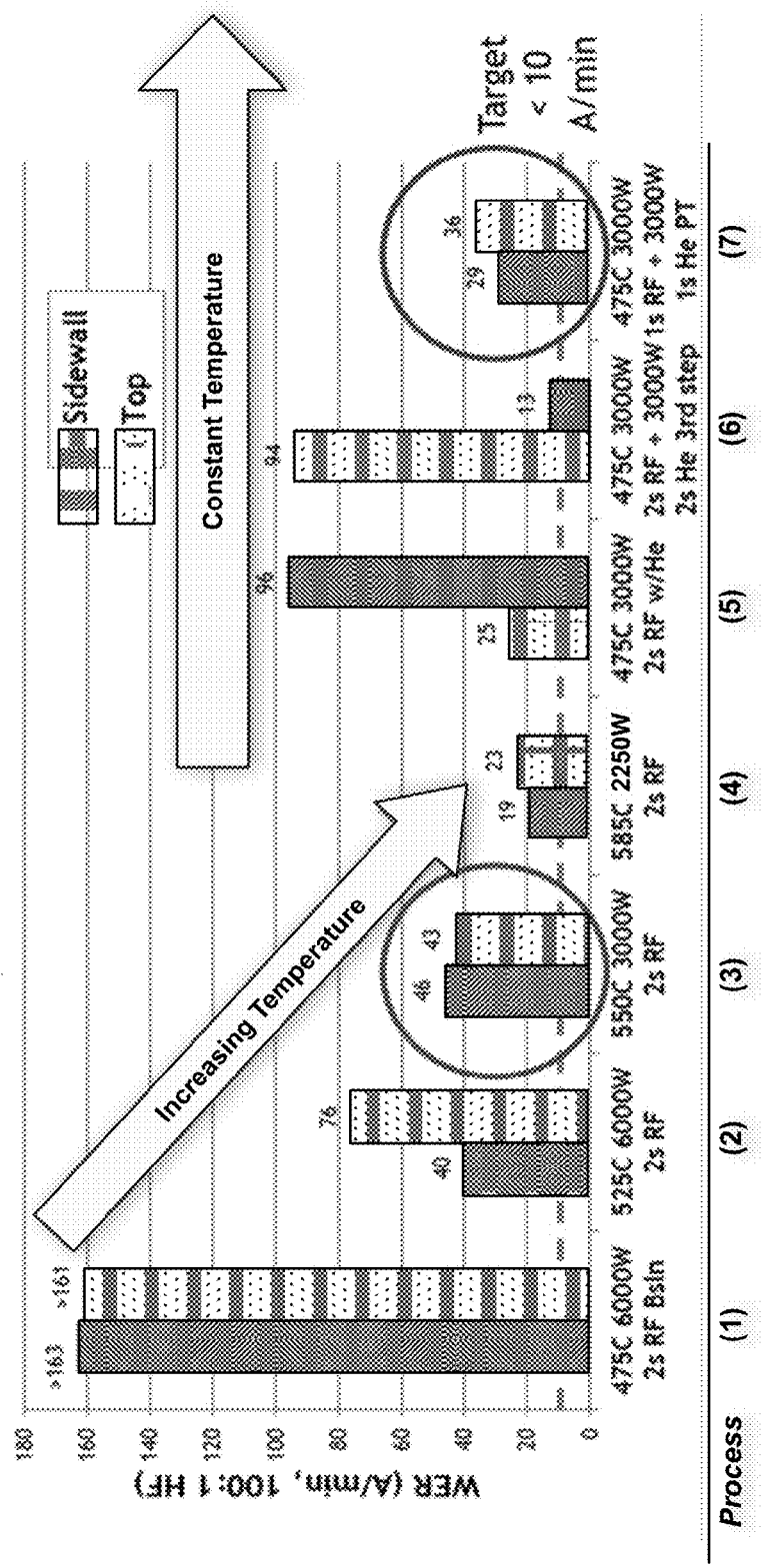
FIG. 4A presents wet etch rate results for a set of example SiN films deposited using various ALD-type film forming techniques at various temperatures. Results are plotted separately for the top regions and sidewalls of a high-aspect ratio feature on a semiconductor substrate for each example SiN film.
Figure 4B:
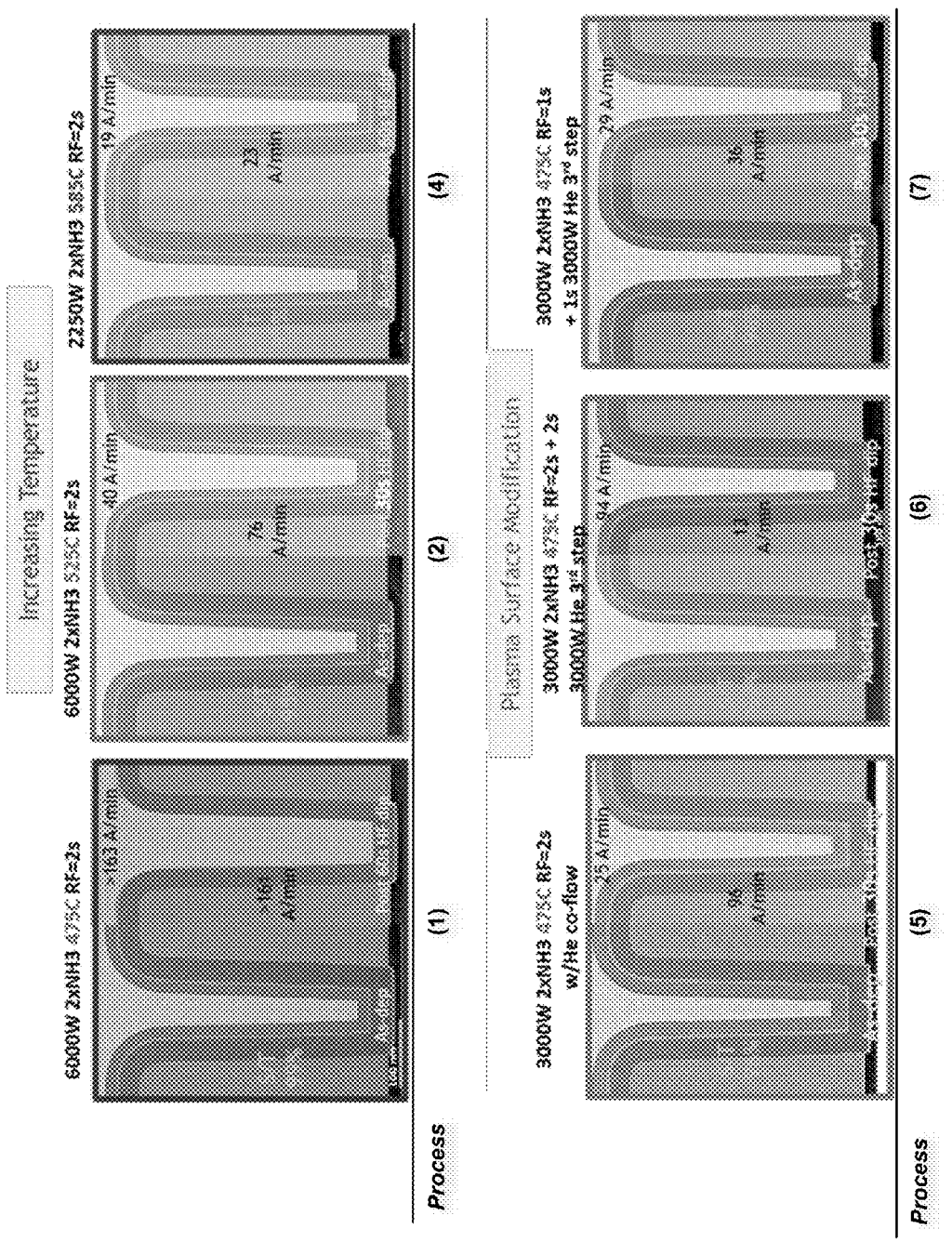
FIG. 4B displays transmission electron microscopy (TEM) images of a high aspect ratio feature of a semiconductor substrate, as-deposited and post-etch, corresponding to the results plotted in FIG. 4A.

FIGS. 4A and 4B exhibit results for a first set of example SiN films deposited using various ALD-type film forming techniques. Specifically, FIG. 4A plots the wet etch rates (WER) corresponding separately to the top and sidewalls of a high-aspect ratio feature on a semiconductor substrate for each example SiN film depositing using different ALD processes labeled (1) through (7) in the figure. The WER is determined by measuring the amount of SiN film etched away on each region (top and sidewalls) after exposure to a 100:1 molar ratio HF solution at 23° C. and 760 torr. No agitation of the solution or substrate was employed during the exposure (i.e., the HF solution was substantially still/motionless relative to the substrate). (Some agitation mechanism would obviously tend to slightly enhance the WER). The amount of SiN film etched away was measured by transmission electron microscopy (TEM), and TEM images of the high aspect ratio feature, as-deposited and post-etch, are exhibited in FIG. 4B for processes (1), and (3) through (7).

Starting at the far left in FIG. 4A, process (1) is a baseline ALD process (also labeled "BsIn" in the figure) which results in the deposition of an SiN film having very high WER on both the tops and sidewalls of the designated semiconductor feature. As indicated in the figure, the WER on the sidewall of the feature is greater than 163 Å/min, and similarly on the top of the feature, the WER is seen to exceed 161 Å/min. The extent that the SiN film is etched away from the feature relative to the as-deposited film is prominently displayed under process (1) in FIG. 4B as well. This baseline ALD process was performed at a substantially constant pedestal-type wafer-holder temperature of 475° C., and employed a plasma power source during the reactive conversion step (step (iii) described above and operation 213 in FIG. 2) set to 6000 W—which since a 4 processing apparatus was used (see the apparatus of FIG. 6 described below), this amounts to a single substrate plasma power of 1500 W, and for a 300 mm wafer, a plasma power density of approximately 2.12 W/cm$^2$. The plasma was turned on for 2 seconds (as indicated in FIGS. 4A and 4B) to cause the formation of the SiN film during the plasma activated reactive conversion step (using a NH$_3$ plasma, as also indicated in the figures). Note that although a relatively low pedestal temperature of 475° C. is employed, WER are unacceptably large.

Process (2) in FIGS. 4A and 4B is essentially the same as the baseline process (1) except that the pedestal temperature is increased from 475° C. in the baseline process to 525° C. in process (2). It is seen in the figures that WER of the resulting SiN film on both top and sidewalls of the feature are substantially improved. Further improvement is seen for the SiN film deposited using process (3) which entails a further elevated pedestal temperature of 550° C. and a reduced per substrate plasma power of 3000 W/4=750 W; and still further improvement is exhibited by the SiN film deposited using process (4) wherein deposition is performed an even higher temperature of 585° C., again with 750 W per substrate plasma power (although, for this particular experiment only 3 process stations were active, so the total plasma power was 3*750 W=2250 W, as shown in FIGS. 4A and 4B). (In each of these four cases, the time interval during which RF power was applied during the conversion step was the same—2 seconds as indicated in the figures.) Thus, with respect to SiN films formed via ALD, the data presented in FIGS. 4A and 4B illustrate that WERs may be decreased on both top regions and sidewalls of a high-aspect ratio semiconductor feature by increasing the temperature at which the ALD process is carried out (as indicated by the downward arrow in FIG. 4A).

However, for the reasons described above, an increased process temperature is not desirable in SiN film-forming techniques, and may in some cases exceed the thermal budget allocated for a given set of fabrication steps. Accordingly, SiN films were formed at a constant lower pedestal temperature of 475° C. using various ALD processes employing various helium (He) plasma treatments as part of each ALD cycle—in order to determine whether any process and/or set of process parameters would produce SiN films at lower temperatures with reduced WERs. Results corresponding to these SiN films formed using helium in the deposition process are shown in FIGS. 4A and 4B labeled as processes (5), (6), and (7).

The first process employing helium (He), process (5), employed He during the reactive/conversion step (iii) of the ALD process. The per substrate plasma power used in this case was 3000 W/4=750 W. It is seen in FIG. 4A that use of He during the plasma activated reaction/conversion step (iii) does reduce WER on the top regions of the feature, but that it does not have the same desired effect on the sidewalls of the feature where WER remains at 96 Å/min. Nearly the opposite result is displayed for process (6) in FIG. 4A where the SiN film deposited using the indicated process conditions achieves a low WER on the sidewalls, but an undesirably high WER of 94 Å/min on the feature's top regions. As indicated in FIGS. 4A and 4B, the process used to generate this opposite result utilized a modified ALD process employing treatment with a He plasma as an additional step (v) of each ALD cycle. Nevertheless, it is seen in this particular example that the desired uniform reduction in WER is not achieved.

However, the final example of FIG. 4A, process (7), uses a modified ALD cycle similar to process (6)—i.e., employing a He plasma treatment as an addition step (v) of each ALD cycle—and is able to achieve the aforementioned desired uniform reduction in WERs. Specifically, the deposited SiN film exhibits a sidewall WER of 29 Å/min and a top region WER of 36 Å/min. Thus, this process (7) is able to achieve WERs corresponding to sidewall and top regions uniformly reduced by approximately a factor of 5 relative to the baseline process (1) at the same low pedestal temperature of 475° C. Note that the SEM images corresponding to processes (2), (5), (6), (7) in FIG. 4B were measured after a 30 second exposure to HF solution at the conditions stated above, whereas the SEM images corresponding to processes (1) and (4) were measured after a 60 second exposure to HF (as indicated in the figure) and thus that the WERs corresponding to processes (1) and (4) appear to be "double" the others. Also note, that in all three of the foregoing examples the same per substrate plasma power of 750 W was employed, but in the last example on the far right, as indicated in the figure, the plasma exposure time was reduced to 1 second in both the conversion step (iii) and the extra He plasma treatment step (v). Without being limited to a particular theory, it is believed that a shorter plasma exposure during the conversion step leaves the deposited layer of SiN more susceptible to densification by the He plasma treatment which follows in step (v). Specifically, and again without being limited to a particular theory, it is thought that the 2 second 3000 W He plasma is too intense, bombarding the top of the feature to such an extent that it causes the WER to be significantly higher on the top. On the other hand, the He with NH$_3$ co-flow treatment works well on the top regions, but it is not effective enough on the sidewall regions to adequately reduce WERs there. However, it is seen that the 1 second 3000 W He plasma treatment is "gentle" enough on the top regions while still being effective enough on the sidewalls to result in a relatively uniform WER on both top regions and sidewalls of the feature.

Figure 4C:
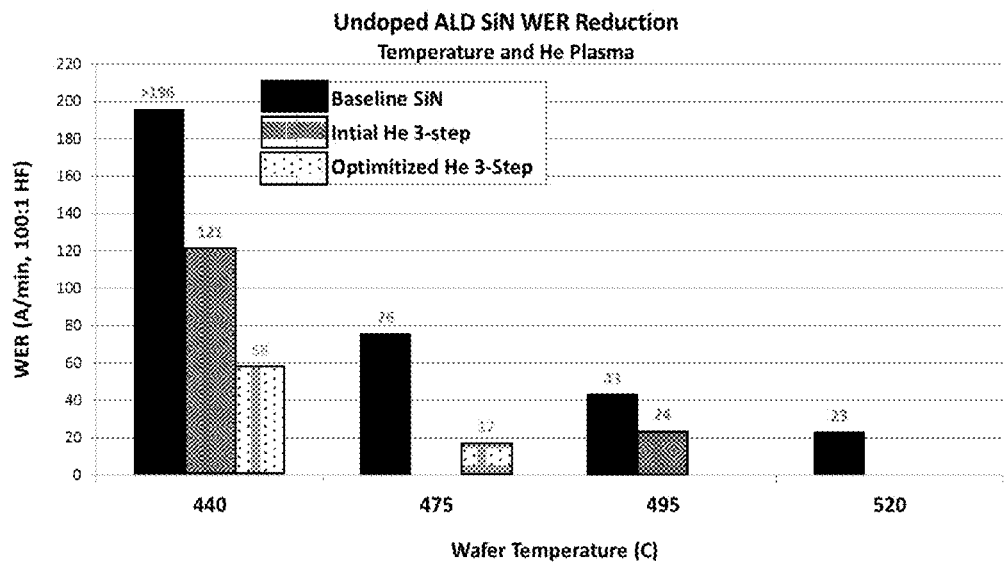
FIG. 4C presents wet etch rate results corresponding to a baseline ALD process at 4 progressively increasing temperatures and wet etch rate results corresponding to a modified ALD process employing a He plasma treatment as an additional step in the ALD cycle with and without process specific optimizations.
Figure 4D:
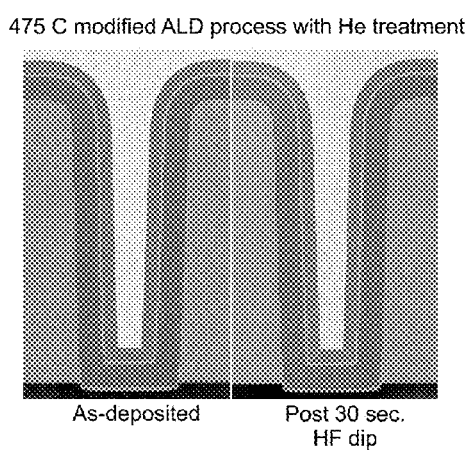
FIG. 4D displays transmission electron microscopy (TEM) images of a high aspect ratio feature of a semiconductor substrate, as-deposited and post-etch, corresponding to one of the process optimized results plotted in FIG. 4C.

Further results are shown in FIGS. 4C and 4D. FIG. 4C plots sidewall WERs corresponding to a baseline ALD process at 4 progressively increasing substrate temperatures, and the decline in sidewall WER with increasing temperature as discussed above is exhibited. (The same HF wet etch conditions were used as stated above, i.e., 100:1 molar ratio HF solution at 23° C. and 760 torr without agitation. However, note that the indicated temperatures in FIGS. 4C and 4D are actual substrate/wafer temperatures, rather than pedestal substrate holder temperatures reported above with respect to FIGS. 4A and 4B. For instance, a pedestal temperature of about 475° C. corresponds to an actual wafer temperature of roughly 440° C.) Plotted alongside the baseline process are sidewall WER results corresponding to a modified ALD process employing a He plasma treatment as an additional step in the ALD cycle and it is seen in the figure that lower sidewall WERs are again achieved. FIG. 4C differentiates between the results of such a modified ALD process with and without process specific optimizations. With and without optimization, the sidewall WER results associated with these modified processes are significantly lower than the baseline process. For instance, it is seen that at a wafer substrate temperature of 495° C., the modified but un-optimized ALD process employing a He plasma treatment step is able to achieve a sidewall WER of 24 Å/min or roughly half the WER of 43 Å/min seen with the baseline process. Even more impressive is the gain in performance observed in the optimized modified ALD process versus the baseline process at a wafer substrate temperature of 475° C., where a low sidewall WER of 17 Å/min is achieved in the optimized process or about a factor of 5 improvement over the 76 Å/min WER corresponding to the baseline process. Transmission electron microscopy (TEM) images corresponding to this result are displayed in FIG. 4D and it is observed that there is little variation in the SiN film deposited with this optimized process before and after wet etch. Process conditions for the optimized ALD technique employing He leading to the results shown in FIGS. 4C and 4D are the same as above for FIGS. 4A and 4B except that here the He plasma treatment duration was 6 seconds employing a plasma power of 125 W per substrate (500 W total for 4 stations), or equivalently a plasma power density relative to the substrate surface area of about 0.18 W/cm$^2$ (0.18≈500/(4*π*15$^2$), e.g. for a 300 mm wafer). In contrast, the unoptimized/initial ALD process (also employing He plasma treatment) shown in FIG. 4C were: He plasma treatment duration of 2 seconds employing a plasma power of 750 W per substrate (3000 W total for 4 stations), or equivalently a plasma power density relative to the substrate surface area of about 1.1 W/cm$^2$ (1.1≈3000/(4*π*15$^2$), e.g. for a 300 mm wafer).

Additional Details Regarding ALD Techniques and Operations

As discussed above, as devices sizes continue to shrink and ICs move to employing 3-D transistors and other 3-D structures, the ability to deposit a precise amount (thickness) of conformal film—such as films of SiN or other dielectrics, for example—has become increasingly important. As stated, atomic layer deposition (ALD) is one technique for accomplishing conformal film deposition that typically involves multiple cycles of deposition in order to achieve a desired thickness of film.

In contrast with a chemical vapor deposition (CVD) process, where activated gas phase reactions are used to deposit films, ALD processes use surface-mediated deposition reactions to deposit films on a layer-by-layer basis. For instance, in one class of ALD processes, a first film precursor (P1) is introduced in a processing chamber in the gas phase, is exposed to a substrate, and is allowed to adsorb onto the surface of the substrate (typically at a population of surface active sites). Some molecules of P1 may form a condensed phase atop the substrate surface, including chemisorbed species and physisorbed molecules of P1. The volume surrounding the substrate surface is then evacuated to remove gas phase and physisorbed P1 so that only chemisorbed species remain. A second film precursor (P2) may then be introduced into the processing chamber so that some molecules of P2 adsorb to the substrate surface. The volume surrounding the substrate within the processing chamber may again be evacuated, this time to remove unbound P2. Subsequently, energy provided to the substrate (e.g., thermal or plasma energy) activates surface reactions between the adsorbed molecules of P1 and P2, forming a film layer. Finally, the volume surrounding the substrate is again evacuated to remove unreacted P1 and/or P2 and/or reaction by-product, if present, ending a single cycle of ALD.

ALD techniques for depositing conformal films may involve a variety of chemistries, and there are many potential variations on the basic ALD process sequence which may be employed depending on the desired reaction chemistry as well as identity and properties of the deposited film. Many such variations are described in detail in U.S. patent application Ser. No. 13/084,399, filed Apr. 11, 2011, titled "PLASMA ACTIVATED CONFORMAL FILM DEPOSITION", U.S. patent application Ser. No. 13/242,084, filed Sep. 23, 2011, titled "PLASMA ACTIVATED CONFORMAL DIELECTRIC FILM DEPOSITION," now U.S. Pat. No. 8,637,411, U.S. patent application Ser. No. 13/224,240, filed Sep. 1, 2011, titled "PLASMA ACTIVATED CONFORMAL DIELECTRIC FILM DEPOSITION", and U.S. patent application Ser. No. 13/607,386, filed Sep. 7, 2012, titled "CONFORMAL DOPING VIA PLASMA ACTIVATED ATOMIC LAYER DEPOSITION AND CONFORMAL FILM DEPOSITION", each of which is incorporated by reference herein in its entirety for all purposes.

As described in these prior applications, a basic ALD cycle for depositing a single layer of material on a substrate may include: (i) adsorbing a film precursor onto a substrate such that it forms an adsorption-limited layer, (ii) removing unadsorbed precursor from the volume surrounding the adsorbed precursor, (iii) reacting the adsorbed precursor to form a layer of film on the substrate, and (iv) removing desorbed film precursor and/or reaction by-product from the volume surrounding the layer of film formed on the substrate. The removing in operations (ii) and (iv) may be done via purging, evacuating, pumping down to a base pressure ("pump-to-base"), etc. the volume surrounding the substrate. It is noted that this basic ALD sequence of operations (i) through (iv) doesn't necessary involve two chemiadsorbed reactive species P1 and P2 as in the example described above, nor does it even necessarily involve a second reactive species, although these possibilities/options may be employed, depending on the desired deposition chemistries involved. As indicated, many variations are possible. For instance and as indicated above, for the deposition of a SiN film, a silicon-containing precursor is typically chemiadsorbed (say as P1), and the species which is reacted with it to form the SiN film is a nitrogen-containing species of which the plasma used to cause the reaction in step (iii) is formed. Thus, in some embodiments, a plasma comprising N-containing ions and/or radicals is used to provide the nitrogen atoms in the deposited SiN film as well as to provide the energy to activate the surface reaction. In other embodiments, it may be envisioned that a silicon-containing precursor may be a first chemiadsorbed species (P1), and a nitrogen-containing species may be a second chemiadsorbed species (P2), and the plasma applied to both chemiadsorbed species in a step (iii) of such an ALD cycle may then be used to provide activation energy and not necessarily the N atoms of the deposited SiN film. Of course, as described above, such an ALD cycle may additionally include a step (v) of densifying the layer of deposited SiN as desired, preceded, in some embodiments by a step (iv) of removing any lingering plasma species, desorbed reactants, and/or reactant by-products, etc.

Due to the adsorption-limited nature of ALD, however, a single cycle of ALD only deposits a thin film of material, and typically only a single monolayer of film material. For example, depending on the exposure time of the film precursor dosing operations and the sticking coefficients of the film precursors (to the substrate surface), each ALD cycle may deposit a film layer only about 0.5 to 3 Å thick. Thus, the sequence of operations in a typical ALD cycle—operations (i) through (iv) just described—are generally repeated multiple times in order to form a conformal film of the desired thickness. Thus, in some embodiments, operations (i) through (iv) are repeated consecutively at least 1 time, or at least 2 times, or at least 3 times, or at least 5 times, or at least 7 times, or at least 10 times in a row. An ALD film may be deposited at a rate of about or between 0.1 Å and 2.5 Å per ALD cycle, or about or between 0.2 Å and 2.0 Å per ALD cycle, or about or between 0.3 Å and 1.8 Å per ALD cycle, or about or between 0.5 Å and 1.5 Å per ALD cycle, or about or between 0.1 Å and 1.5 Å per ALD cycle, or about or between 0.2 Å and 1.0 Å per ALD cycle, or about or between 0.3 Å and 1.0 Å per ALD cycle, or about or between 0.5 Å and 1.0 Å per ALD cycle.

In some film forming chemistries, an auxiliary reactant or co-reactant—in addition to what is referred to as the "film precursor"—may also be employed. In certain such embodiments, the auxiliary reactant or co-reactant may be flowed continuously during a subset of steps (i) through (iv) or throughout each of steps (i) through (iv) as they are repeated. In some embodiments, this other reactive chemical species (auxiliary reactant, co-reactant, etc.) may be adsorbed onto the substrate surface with the film precursor prior to its reaction with the film precursor (as in the example involving precursors P1 and P2 described above), however, in other embodiments, it may react with the adsorbed film precursor as it contacts it without prior adsorption onto the surface of the substrate, per se. Also, in some embodiments, operation (iii) of reacting the adsorbed film precursor may involve contacting the adsorbed film precursor with a plasma which, depending on the embodiment, may, in addition to providing activation energy, may provide the auxiliary reactant/co-reactant. For instance, in the processes described above involving SiN film formation via ALD, the auxiliary reactant/co-reactant may be thought of as the N-containing species which is used to form the plasma in step (iii).

In some embodiments, a multi-layer deposited film may include regions/portions of alternating composition formed, for example, by conformally depositing multiple layers sequentially having one composition, and then conformally depositing multiple layers sequentially having another composition, and then potentially repeating and alternating these two sequences. Some of these aspects of deposited ALD films are described, for example, in U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION", which is incorporated by reference herein in its entirety for all purposes. Further examples of conformal films having portions of alternating composition—including films used for doping an underlying target IC structure or substrate region— as well as methods of forming these films, are described in detail in: U.S. patent application Ser. No. 13/084,399, filed Apr. 11, 2011, and titled "PLASMA ACTIVATED CONFORMAL FILM DEPOSITION", U.S. patent application Ser. No. 13/242,084, filed Sep. 23, 2011, and titled "PLASMA ACTIVATED CONFORMAL DIELECTRIC FILM DEPOSITION," now U.S. Pat. No. 8,637,411; U.S. patent application Ser. No. 13/224,240, filed Sep. 1, 2011, and titled "PLASMA ACTIVATED CONFORMAL DIELECTRIC FILM DEPOSITION"; U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is incorporated by reference herein in its entirety for all purposes.

As detailed in the above referenced specifications, ALD processes may be used to deposit conformal silicon oxide (SiOx) films, silicon carbide (SiC) films, silicon nitride (SiN) films, silicon carbonitride (SiCN) films, or combinations thereof. Silicon-carbon-oxides and silicon-carbon-oxynitrides, and silicon-carbon-nitrides may also be formed in some varieties of ALD-formed films. Methods, techniques, and operations for depositing these types of films are described in detail in U.S. patent application Ser. No. 13/494,836, filed Jun. 12, 2012, titled "REMOTE PLASMA BASED DEPOSITION OF SiOC CLASS OF FILMS,"; U.S. patent application Ser. No. 13/907,699, filed May 31, 2013, titled "METHOD TO OBTAIN SiC CLASS OF FILMS OF DESIRED COMPOSITION AND FILM PROPERTIES,"; U.S. patent application Ser. No. 14/062,648, titled "GROUND STATE HYDROGEN RADICAL SOURCES FOR CHEMICAL VAPOR DEPOSITION OF SILICON-CARBON-CONTAINING FILMS"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is hereby incorporated by reference in its entirety and for all purposes.

Multiple ALD cycles may be repeated to build up stacks of conformal layers. In some embodiments, each layer may have substantially the same composition whereas in other embodiments, sequentially ALD deposited layers may have differing compositions, or in certain such embodiments, the composition may alternate from layer to layer or there may be a repeating sequence of layers having different compositions, as described above. Thus, depending on the embodiment, certain stack engineering concepts, such as those disclosed in the patent applications listed and incorporated by reference above (U.S. patent application Ser. Nos. 13/084,399, 13/242,084, and 13/224,240) may be used to modulate boron, phosphorus, or arsenic concentration in these films.

Film-Forming ALD Chemistries

Deposition of SiN films may utilize one or more silicon-containing film precursors which may be selected from a variety of compounds. Suitable precursors may include organo-silicon reactants selected and supplied to provide desired composition properties, and in some cases, physical or electronic properties. Examples of silicon-containing reactants/film-precursors may include silanes, alkyl silanes, siloxanes, alkoxysilanes, halosilanes, and aminosilanes, among others.

Regarding the silanes, non-limiting examples which may, in some embodiments, be used to form SiN films include silane ($SiH_4$), disilane ($Si_2H_6$), trisilane, and higher silanes.

Alkylsilanes—silicon-containing compounds having one or more silicon atom(s) bonded to one or more alkyl groups and/or hydrogen atoms—may also, in some embodiments, be used to form SiN films. Depending on the embodiment, the silicon atom(s) may be bonded to 4 alkyl groups, or 3 alkyl groups and a hydrogen, or 2 alkyl groups and 2 hydrogens, or 1 alkyl group and 3 hydrogens. Possible alkyl groups which may be selected include, but are not limited to, the Me, Et, i-Pr, n-Pr, and t-butyl functional groups. Specific examples of alkylsilanes suitable for use as film-precursors may include, but are not limited to, methylsilane ($H_3SiCH_3$), ethylsilane, isopropylsilane, t-butylsilane, dimethylsilane ($H_2Si(CH_3)_2$), trimethylsilane ($HSi(CH_3)_3$), tetramethylsilane ($Si(CH_3)_4$), diethylsilane, triethylsilane, di-t-butylsilane, allylsilane, sec-butylsilane, thexylsilane, isoamylsilane, t-butyldisilane, and di-t-butyldisilane.

Additionally, higher-order silanes may be used in place of monosilanes. In silicon compounds having multiple silicon atoms where a silicon atom is bonded to silicon atom, the number of other substituents on each is reduced by one. An example of one such disilane from the alkyl silane class is hexamethyldisilane (HMDS). Another example of a disilane from the alkyl silane class can include pentamethyldisilane (PMDS), which can be used to form SiC films. In some embodiments, one of the silicon atoms can have a carbon-containing or alkoxy-containing group exclusively attached to it, and one of the silicon atoms can have a hydrogen atom exclusively attached to it. Other types of alkyl silanes can include alkylcarbosilanes. Alkylcarbosilanes can have a branched polymeric structure with a carbon bonded to a silicon atom as well as alkyl groups bonded to a silicon atom. Examples include dimethyl trimethylsilyl methane (DT-MSM) and bis-dimethylsilyl ethane (BDMSE). Still other types of alkyl silanes can include silazanes and alkyldisilazanes. Alkyldisilazanes include silazanes and alkyl groups bonded to two silicon atoms. An example includes 1,1,3,3-tetramethyldisilazane (TMDSN). In some embodiments, TMDSN can form SiCN films.

Halosilanes—silicon-containing compounds having one or more silicon atom(s) bonded to one or more halogen atoms—may also, in some embodiments, be used to form SiN films. Depending on the embodiment, the silicon atom(s) may be bonded to 4 halogen atoms, or 3 halogen atoms, or 2 halogen atoms, or 1 halogen atom. Iodosilanes, bromosilanes, chlorosilanes, and fluorosilanes may be suitable for use as film-precursors. Although halosilanes, particularly fluorosilanes, may form reactive halide species that can etch silicon materials, in certain embodiments described herein, the silicon-containing reactant is not present when a plasma is struck. Specific examples of chlorosilanes suitable for use as film-precursors include, but are not limited to, tetrachlorosilane ($SiCl_4$), trichlorosilane ($HSiCl_3$), dichlorosilane ($H_2SiCl_2$), monochlorosilane ($ClSiH_3$), hexachlorodisilane, chloroallylsilane, chloromethylsilane, dichloromethylsilane ($SiHCH_3Cl_2$), chlorodimethylsilane, chloroethylsilane, t-butylchlorosilane, di-t-butylchlorosilane, chloroisopropylsilane, chloro-sec-butylsilane, t-butyldimethylchlorosilane, and ethyldimethylchlorosilane. Specific examples of iodosilanes, bromosilanes, and fluorosilanes include, but are not limited to, compounds similar in molecular structure to these chlorine containing compounds but having, in place of the chorine atom(s), either iodine, bromine, or fluorine atom(s), respectively. For instance, the bromosilane corresponding to trichlorosilane ($HSiCl_3$) is tribromosilane ($HSiBr_3$).

Aminosilanes—silicon-containing compounds having one or more silicon atom(s) bonded to one or more amine groups—may also, in some embodiments, be used to form SiN films. Depending on the embodiment, the silicon atom(s) may be bonded to 4 amine groups, or 3 amine groups, or 2 amine groups, or 1 amine group. For instance, a particular film-precursor having 2 amine groups and 2 hydrogen atoms bonded to a central silicon atom is BTBAS (bis-t-butylaminosilane, $SiH_2(NHC(CH_3)_3)_2$). Other specific examples of aminosilanes suitable for use as film-precursors include, but are not limited to, mono-, di-, tri-, and tetra-aminosilane ($H_3SiNH_2$, $H_2Si(NH_2)_2$, $HSi(NH_2)_3$, and $Si(NH_2)_4$, respectively). Substituted mono-, di-, tri-, and tetra-aminosilanes may also serve as suitable film-precursors including, but not limited to, such compounds having their amine group substituted with the Me, Et, i-Pr, n-Pr, and t-butyl functional groups. Specific examples include t-butylaminosilane, methylaminosilane, t-butylsilanamine, n-tert-butyltrimethylsilyiamine, t-butyl silylcarbamate, $SiHCH_3(N(CH_3)_2)_2$, $SiH(N(CH_3)_2)_3$, $SiHCl(N(CH_3)_2)_2$, $Si(CH_3)_2(NH_2)_2$, $(Si(CH_3)_2NH)_3$, $(NR)_2Si(CH_3)_2$ (where R is either a hydrogen or is selected from the Me, Et, i-Pr, n-Pr, and t-butyl functional groups), and trisilylamine ($N(SiH_3)_3$). Other specific examples include dimethylamino, bis-dimethylamino methylsilane (BDMAMS), and tris-dimethylamino silane (TDMAS), 2,2-bis(dimethylamino)-4,4-di methyl-2,4-disilapentane, 2,2,4-trimethyl-4-dimethylamino-3,4-disilapentane, dimethylaminodimethylsilane, bis(dimethylamino)methylsilane, and tris(dimethylamino)silane. 1,1,3,3-tetramethyldisilazane is a non-limiting example of a silazane.

For the deposition of an SiN film, an appropriate silicon-containing reactant/film-precursor, such as those described above, may be used in conjunction with a nitrogen-containing co-reactant. Non-limiting examples of nitrogen-containing co-reactants which may be used include ammonia, hydrazine, amines such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing co-reactant contains at least one nitrogen, but may also contain heteroatoms other than nitrogen. Thus, for example, hydroxylamine, t-butyloxycarbonyl amine, and N-t-butyl hydroxylamine are considered nitrogen-containing reactants. In some embodiments, the N-containing reactant may be $N_2$. In some embodiments, the N-containing co-reactant may be used as a species in an ionized or free-radical plasma in order to activate the film-forming surface reaction. In certain such embodiments employing a plasma based on a N-containing co-reactant, referred N-containing co-reactants include $NH_3$, $N_2$, and the amines, specifically t-butyl amine.

Finally, it is noted that because multiple ALD cycles may be repeated to build up stacks of conformal layers, in some embodiments, each layer may have substantially the same composition whereas in other embodiments, sequentially ALD deposited layers may have differing compositions, or in certain such embodiments, the composition may alternate from layer to layer or there may be a repeating sequence of layers having different compositions.

Substrate Processing Apparatuses

The methods described herein may be performed with any suitable semiconductor substrate processing apparatus. A suitable apparatus includes hardware for accomplishing the process operations and a system controller having instructions for controlling process operations in accordance with the various SiN film forming ALD methodologies and densification techniques disclosed herein. In some embodiments, the hardware may include one or more process stations included in a multi-station substrate processing tool, and a controller having (or having access to) machine-readable instructions for controlling process operations in accordance with the film forming techniques disclosed herein.

Thus, in some embodiments, an apparatus suitable for depositing wet etch resistant SiN films on semiconductor substrates may include a processing chamber, a substrate holder in the processing chamber, one or more gas inlets for flowing gases into the processing chamber, a vacuum source for removing gases from the processing chamber, a plasma generator for generating plasmas within the processing chamber, and one or more controllers comprising machine-readable instructions for operating the one or more gas inlets, vacuum source, and plasma generator to deposit SiN film layers onto semiconductor substrates. Said instructions executed by the controller may include instructions for performing ALD operations (i) though (vi) as described above, and instructions for repeating ALD operations (i) through (vi) multiple times to form multiple layers of densified SiN film. Suitable system controllers are described in further detail below.

Figure 5:
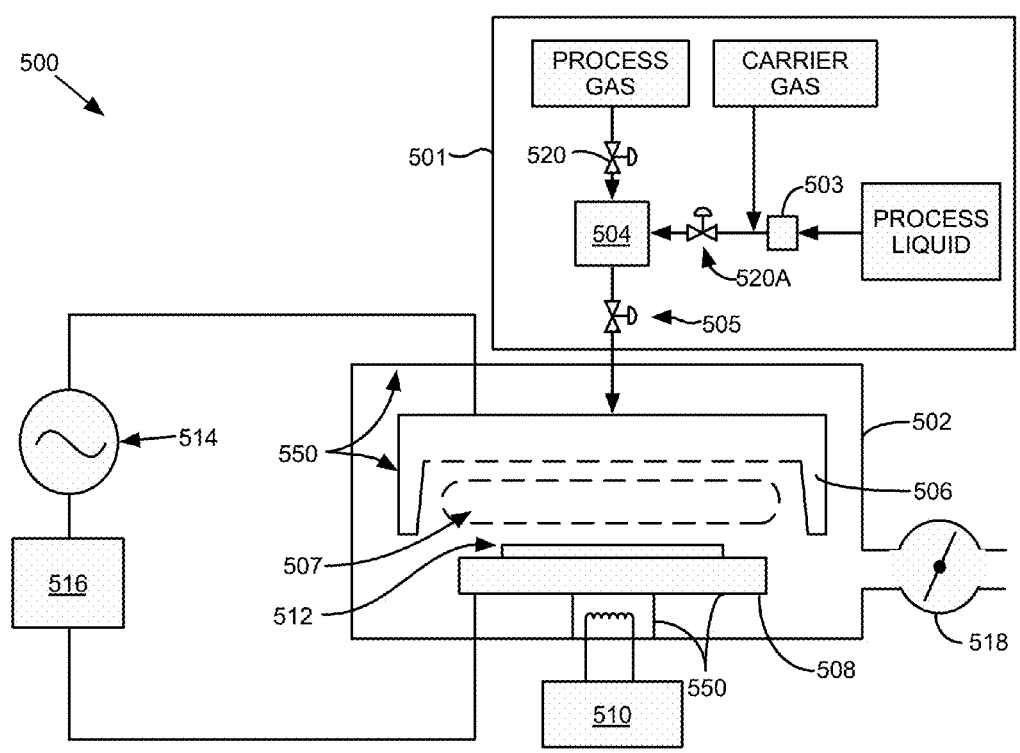
FIG. 5 is a cross-sectional schematic of a substrate processing apparatus having a processing chamber with a single process station.
Figure 6:
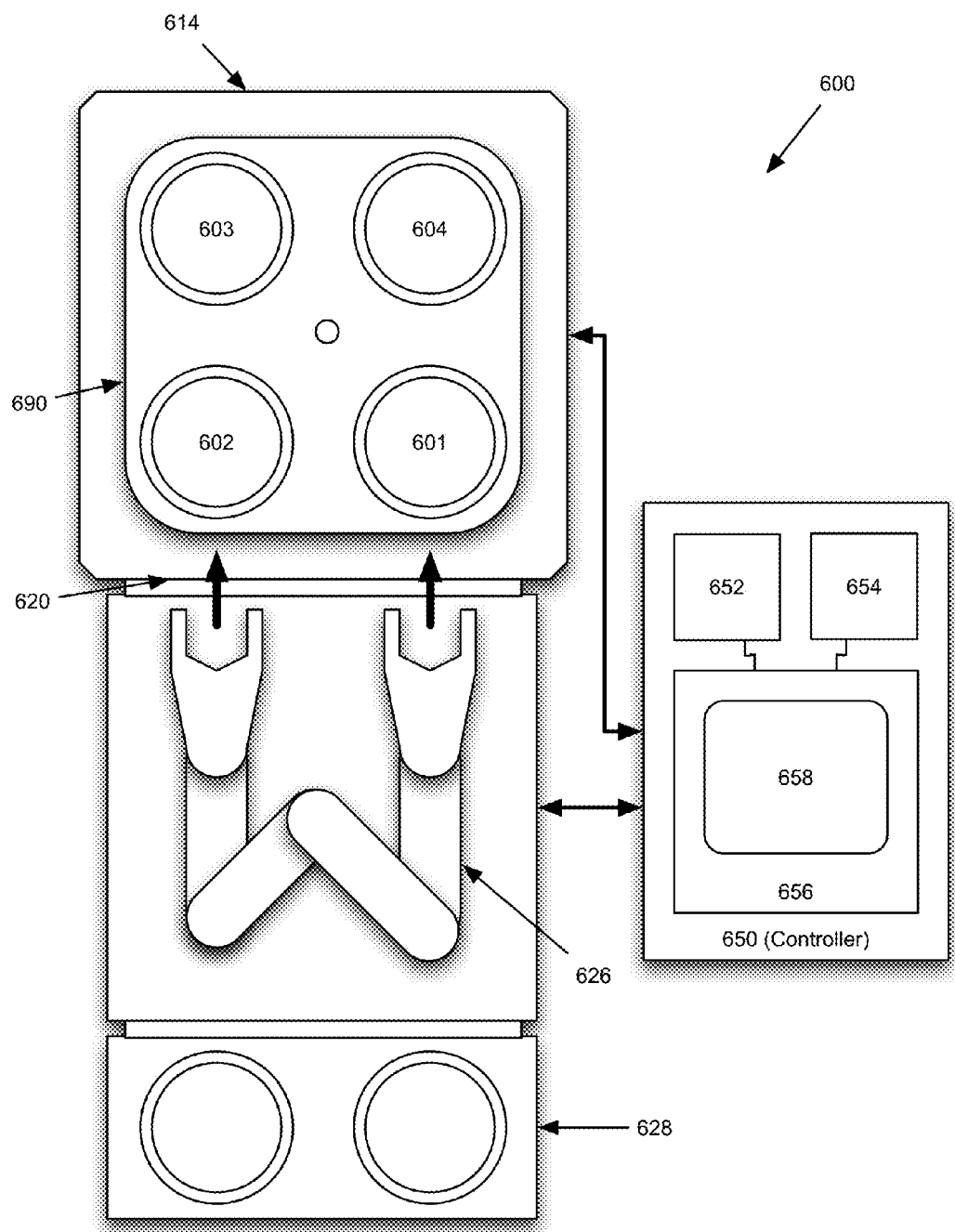
FIG. 6 is a schematic of a 4-station substrate processing apparatus having a substrate handler robot for loading and unloading substrates from 2 process stations, a carousel for transferring substrates between process stations, and a controller for operating the apparatus.

Accordingly, FIG. 5 schematically illustrates an embodiment of a substrate processing apparatus 500 for performing the ALD techniques disclosed herein. Processing apparatus 500 is depicted as having a process chamber body 502 for maintaining a low-pressure environment which, for simplicity, is depicted as hosting a standalone process station. However, it will be appreciated that a plurality of process stations may be included in a common process tool environment—e.g., within a common reaction chamber—as described herein. For example, FIG. 6 depicts an embodiment of a multi-station processing tool. Further, it will be appreciated that, in some embodiments, one or more hardware parameters of processing apparatus 500/600, including those discussed in detail above, may be adjusted programmatically by one or more system controllers.

Referring again to FIG. 5, processing chamber 502 of apparatus 500 has a single substrate holder 508 in an interior volume which may be maintained under vacuum by vacuum pump 518. Also fluidically coupled to the chamber for the delivery of (for example) film precursors, carrier and/or purge and/or process gases, secondary/co-reactants, etc. is gas delivery system 501 and showerhead 506. Equipment for generating a plasma within the processing chamber is also shown in FIG. 5 and will be descried in further detail below. In any event, as it is described in detail below, the apparatus schematically illustrated in FIG. 5 provides the basic equipment for performing film deposition operations such as ALD on semiconductor substrates.

Process station 500 fluidly communicates with reactant delivery system 501 for delivering process gases to a distribution showerhead 506. Reactant delivery system 501 includes a mixing vessel 504 for blending and/or conditioning process gases for delivery to showerhead 506. One or more mixing vessel inlet valves 520 may control introduction of process gases to mixing vessel 504.

Some reactants may be stored in liquid form prior to vaporization and subsequent delivery to the process chamber 502. The embodiment of FIG. 5 includes a vaporization point 503 for vaporizing liquid reactant to be supplied to mixing vessel 504. In some embodiments, vaporization point 503 may be a heated liquid injection module. In some embodiments, vaporization point 503 may be a heated vaporizer. The saturated reactant vapor produced from such modules/vaporizers may condense in downstream delivery piping when adequate controls are not in place (e.g., when no helium is used in vaporizing/atomizing the liquid reactant). Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 503 may be heat treated. In some examples, mixing vessel 504 may also be heat treated. In one non-limiting example, piping downstream of vaporization point 503 has an increasing temperature profile extending from approximately 100° C. to approximately 150° C. at mixing vessel 504.

As mentioned, in some embodiments the vaporization point 503 may be a heated liquid injection module ("liquid injector" for short). Such a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller (LFC) upstream of vaporization point 503 may be provided for controlling a mass flow of liquid for vaporization and delivery to processing chamber 502. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 506 distributes process gases and/or reactants (e.g., film precursors) toward substrate 512 at the process station, the flow of which is controlled by one or more valves upstream from the showerhead (e.g., valves 520, 520A, 505). In the embodiment shown in FIG. 5, the substrate 512 is located beneath showerhead 506, and is shown resting on a pedestal 108. It will be appreciated that showerhead may have any suitable shape, and may have any suitable number and arrangement of ports for distributing processes gases to the substrate.

In some embodiments, a microvolume 507 is located beneath showerhead 506. Performing an ALD process in a microvolume in the process station near the substrate rather than in the entire volume of a processing chamber may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 508 may be raised or lowered to expose the substrate to microvolume 507 and/or to vary a volume of microvolume 507. For example, in a substrate transfer phase, pedestal may be lowered to allow substrate to be loaded onto the pedestal. During a deposition on substrate process phase, pedestal may be raised to position the substrate within microvolume 507. In some embodiments, said microvolume may completely enclose the substrate as well as a portion of pedestal to create a region of high flow impedance during a deposition process.

Optionally, pedestal 508 may be lowered and/or raised during portions the deposition process to modulate process pressure, reactant concentration, etc. within microvolume 507. In one scenario where processing chamber body 502 remains at a base pressure during the process, lowering the pedestal may allow said microvolume to be evacuated. Example ratios of microvolume to process chamber volume include, but are not limited to, volume ratios between 1:500 and 1:10. It will be appreciated that, in some embodiments, pedestal height may be adjusted programmatically by a suitable system controller.

In another scenario, adjusting a height of pedestal may allow a plasma density to be varied during plasma activation and/or treatment cycles included, for example, in an ALD or CVD process. At the conclusion of a deposition process phase, pedestal may be lowered during another substrate transfer phase to allow removal of substrate from pedestal.

While the example microvolume variations described herein refer to a height-adjustable pedestal, it will be appreciated that, in some embodiments, a position of showerhead 506 may be adjusted relative to pedestal 508 to vary a volume of microvolume 507. Further, it will be appreciated that a vertical position of the pedestal and/or the showerhead may be varied by any suitable mechanism within the scope of the present disclosure. In some embodiments, the pedestal may include a rotational axis for rotating an orientation of the substrate. It will be appreciated that, in some embodiments, one or more of these example adjustments may be performed programmatically by one or more suitable system controllers having machine-readable instructions for performing all or a subset of the foregoing operations.

Returning to the embodiment shown in FIG. 5, showerhead 506 and pedestal 508 may electrically communicate with RF power supply 514 and matching network 516 for powering a plasma generated within the processing chamber. In some embodiments, the plasma energy may be controlled (e.g., via the system controller having appropriate machine-readable instructions) by controlling one or more of a process station pressure, a gas concentration, an RF power level, the frequency of the RF power, and a plasma power pulse timing. For example, RF power supply 514 and matching network 516 may be operated at any suitable power to form a plasma having a desired composition of ions and/or radical species. Various examples of suitable plasma powers—in terms of the RF power level set in the plasma power generator as well as the plasma energy density in the chamber—are described above and accordingly depend on the particular methodology being employed. Depending on the embodiment, RF power supply 514 may provide RF power of any suitable frequency for the processing method being performed. In some embodiments, RF power supply 514 may be configured to control high-frequency (HF) RF power and low-frequency (LF) RF power sources independently of one another. Low-frequencies generated by an RF power source may range from between about 50 kHz and 500 kHz, depending on the embodiment. High-frequencies generated by an RF power source may range from between about 1.8 MHz and 2.45 GHz, depending on the embodiment. It will be appreciated that any suitable parameter may be modulated discretely or continuously to provide plasma energy for the surface reactions. In some embodiments, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy (OES) sensors. In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert gas (e.g., helium) and/or a reactant gas (e.g., $NH_3$), instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasmas may be struck and maintained on the order of a few seconds or more. In some deposition processes, plasmas may be struck and maintained for much shorter durations. The chosen duration depends on the nature and purpose of the plasma being generated. Suitable plasma durations and substrate exposure times are indicated above with respect to the particular film deposition techniques disclosed herein. It is noted that very short RF plasma durations may accordingly require very quick stabilization of the plasma. To accomplish this, the plasma generator may be configured such that the impedance match is preset to a particular voltage, while the frequency is allowed to float. Conventionally, high-frequency plasmas are generated at an RF frequency set to about 13.56 MHz, however in some configurations the frequency may be allowed to float to a value that is different from this standard value. By permitting the frequency to float while fixing the impedance match to a predetermined voltage, the plasma can stabilize much more quickly, a result which may be important when using the very short plasma durations sometimes associated with ALD cycles.

In certain embodiments, multiples of the standard HF value of 13.56 MHz may be used to generate even higher frequency plasmas. As when the standard value of 13.56 MHz is used, HF radiation generated at a higher frequency multiple of 13.56 MHz may also be allowed to float around the exact value of the multiple. Multiples of 13.56 MHz which may be used, depending on the embodiment, include 27.12 MHz (=2*13.56 MHz), 40.68 MHz (=3*13.56 MHz), 54.24 MHz (=4*13.56 MHz), and so forth. The frequency tuning about the multiple of 13.56 MHz may include frequency variation of about +/−1 Mhz, or more particularly, of about +/−0.5 MHz. Higher RF frequencies result in a more energetic plasma having higher density, lower sheet voltages, and less ion bombardment and directionality which tends to be beneficial when depositing onto high aspect ratio 3D structures.

In some embodiments, pedestal 508 may be temperature controlled via heater 510. Further, in some embodiments, pressure control for processing apparatus 500 may be provided by one or more valve-operated vacuum sources such as butterfly valve 518. As shown in the embodiment of FIG. 5, butterfly valve 518 throttles a vacuum provided by a downstream vacuum pump (not shown). However, in some embodiments, pressure control of processing apparatus 500 may also be adjusted by varying a flow rate of one or more gases introduced to processing chamber 502. In some embodiments, the one or more valve-operated vacuum sources—such as butterfly valve 518—may be used for removing film precursor from the volumes surrounding the process stations during the appropriate ALD operational phases.

While in some circumstances a substrate processing apparatus like that of FIG. 5 may be sufficient, when time-consuming film deposition operations are involved, it may be advantageous to increase substrate processing throughput by performing multiple deposition operations in parallel on multiple semiconductor substrates simultaneously. For this purpose, a multi-station substrate processing apparatus may be employed like that schematically illustrated in FIG. 6. The substrate processing apparatus 600 of FIG. 6, still employs a single substrate processing chamber 614, however, within the single interior volume defined by the walls of the processing chamber, are multiple substrate process stations, each of which may be used to perform processing operations on a substrate held in a substrate holder at that process station. Note that in some embodiments, by maintaining multiple stations in a common low-pressure environment, defects caused by vacuum breaks between film deposition processes performed at the various stations may be avoided.

In this particular embodiment, the multi-station substrate processing apparatus 600 is shown having 4 process stations 601, 602, 603, and 604. The apparatus also employs a substrate loading device, in this case substrate handler robot 626 configured to move substrates from a cassette loaded from a pod 628, through atmospheric port 620, into the processing chamber 614, and finally onto one or more process stations, specifically, in this case, process stations 601 and 602. Also present is substrate carousel 690 serving as a substrate transferring device, in this case, for transferring substrates between the various process stations 601, 602, 603, and 604.

In the embodiment shown in FIG. 6, the substrate loading device is depicted as substrate handler robot 626 having 2 arms for substrate manipulation, and so, as depicted, it could load substrates at both stations 601 and 602 (perhaps simultaneously, or perhaps sequentially). Then, after loading at stations 601 and 602, the substrate transferring device, carousel 690 depicted in FIG. 6, can do a 180 degree rotation (about its central axis, which is substantially perpendicular to the plane of the substrates (coming out of the page), and substantially equidistant between the substrates) to transfer the two substrates from stations 601 and 602 to stations 603 and 604. At this point, handler robot 626 can load 2 new substrates at stations 601 and 602, completing the loading process. To unload, these steps can be reversed, except that if multiple sets of 4 wafers are to be processed, each unloading of 2 substrates by handler robot 626 would be accompanied by the loading of 2 new substrates prior to rotating the transferring carousel 690 by 180 degrees. Analogously, a one-armed handler robot configured to place substrates at just 1 station, say 601, would be used in a 4 step load process accompanied by 4 rotations of carousel 690 by 90 degrees to load substrates at all 4 stations. It is noted that while FIG. 6 depicts a two-armed substrate handler robot 626 as an example of a substrate loading device, and a carousel 690 as an example of a substrate transferring device, it will be appreciated that other types of suitable substrate loading and transferring devices may be employed as well.

Other similar multi-station processing apparatuses may have more or fewer processing stations depending on the embodiment and, for instance, the desired level of parallel wafer processing, size/space constraints, cost constraints, etc. Also shown in FIG. 6 and described in greater detail below is system controller 650 which controls the operation of the substrate processing apparatus to accomplish the various ALD film forming methodologies disclosed herein.

Note that various efficiencies may be achieved through the use of a multi-station substrate processing apparatus like that shown in FIG. 6 with respect to both equipment cost and operational expenses. For instance, a single vacuum pump (not shown in FIG. 6, but e.g. 518 in FIG. 5) may be used to evacuate spent process gases, create a single high-vacuum environment, etc. with respect to all 4 process stations. Likewise, in some embodiments, a single showerhead may be shared amongst all processing stations within a single processing chamber.

However, in other embodiments, each process station may have its own dedicated showerhead for gas delivery (see, e.g., 506 in FIG. 5), although in certain such embodiments a common gas delivery system may be employed (e.g., 501 in FIG. 5). In embodiments having a dedicated showerhead per process station, each may have its temperature individually adjusted and/or controlled. For instance, each showerhead may be temperature adjusted relative to the substrate to which it delivers gases, or relative to the substrate holder with which it is associated, etc. By the same measure, in embodiments where substrate holders are actively temperature controlled/adjusted, via heating and/or cooling for instance, the temperature of each substrate holder may be individually adjusted.

Other hardware elements which may be shared amongst process stations or multiply present and individually dedicated per process station include certain elements of the plasma generator equipment. All process stations may share a common plasma power supply, for example, but, on the other hand, if dedicated showerheads are present, and if they are used to apply plasma-generating electrical potentials then these represent elements of the plasma generating hardware which are individually dedicated to the different process stations. Once again, each of these process station-specific showerheads may have its temperature individually adjusted according to, for example, differences in the thermal properties of the specific process stations and the particulars of the ALD processes being used.

Of course, it is to be understood that such efficiencies may also be achieved to a greater or lesser extent by using more or fewer numbers of process stations per processing chamber. Thus, while the depicted processing chamber 614 comprises 4 process stations, it will be understood that a processing chamber according to the present disclosure may have any suitable number of stations. For example, in some embodiments, a processing chamber may have 1, or 2, or 3, or 4, or 5, or 6, or 7, or 8, or 9, or 10, or 11, or 12, or 13, or 14, or 15, or 16, or more process stations (or a set of embodiments may be described as having a number of process stations per reaction chamber within a range defined by any pair of the foregoing values, such as having 2 to 6 process stations per reaction chamber, or 4 to 8 process stations per reaction chamber, or 8 to 16 process stations per reaction chamber, etc.).

Moreover, it should be understood that the various process stations within a common processing chamber may be used for duplicate parallel processing operations or differing processing operations, depending on the embodiment. For example, in some embodiments, some process stations may be dedicated to an ALD process mode while others are dedicated to a CVD process mode, while still others may be switchable between an ALD process mode and a CVD process mode.

System Controllers

FIG. 6 also depicts an embodiment of a system controller 650 employed to control process conditions and hardware states of process tool 600 and its process stations. System controller 650 may include one or more memory devices 656, one or more mass storage devices 654, and one or more processors 652. Processor 652 may include one or more CPUs, ASICs, general-purpose computer(s) and/or specific purpose computer(s), one or more analog and/or digital input/output connection(s), one or more stepper motor controller board(s), etc.

In some embodiments, system controller 650 controls some or all of the operations of process tool 600 including the operations of its individual process stations. System controller 650 may execute machine-readable system control instructions 658 on processor 652—the system control instructions 658, in some embodiments, loaded into memory device 656 from mass storage device 654. System control instructions 658 may include instructions for controlling the timing, mixture of gaseous and liquid reactants, chamber and/or station pressure, chamber and/or station temperature, wafer temperature, target power levels, RF power levels, RF exposure time, substrate pedestal, chuck, and/or susceptor position, and other parameters of a particular process performed by process tool 600. These processes may include various types of processes including, but not limited to, processes related to deposition of film on substrates.

Thus, the machine-readable instructions 658 executed by system controller 650 may include instructions for performing ALD operations (i) though (vi) as described above, and instructions for repeating ALD operations (i) through (vi) multiple times to form multiple layers of densified SiN film. For instance, to accomplish the ALD film-forming methodologies disclosed herein, the instructions of one or more system controllers may include:

instructions for operating the one or more gas inlets to flow a film precursor into the processing chamber and adsorbing the film precursor onto a semiconductor substrate held in the substrate holder such that the film precursor forms an adsorption-limited layer on the substrate, the film precursor comprising Si;

instructions for operating the vacuum source to remove at least some unadsorbed film precursor from the volume surrounding the adsorbed film precursor;

instructions for operating the plasma generator to generate a plasma comprising N-containing ions and/or radicals, and reacting the adsorbed film precursor by exposing it to said plasma to form a SiN film layer on the substrate, to be executed after executing the instructions for removing unadsorbed film precursor;

instructions for operating the plasma generator to generate a plasma comprising He having a power density relative to the substrate surface of between about 0.035 and 2.2 W/cm$^2$, and densifying the SiN film layer by exposing it to said plasma for between 0.5 and 15 seconds, to be executed after executing instructions for reacting the adsorbed precursor; and instructions for repeating the foregoing instructions to form additional densified SiN film layers on the substrate.

In some embodiments, the instructions may further include:

instructions for operating the vacuum source to remove at least some N-containing ions, N-containing radicals, desorbed film precursor, and/or reaction by-product from the volume surrounding the SiN film layer to be executed after executing the instructions for reacting the adsorbed film precursor but before executing the instructions for densifying the deposited film layer; and instructions for operating the vacuum source to remove at least some He from the volume surrounding the SiN film layer to be executed after executing the instructions for densifying the deposited film layer.

System control instructions 658 may be configured in any suitable way. For example, various process tool component subroutines or control objects may be written to control operation of the process tool components necessary to carry out various process tool processes. System control instructions 658 may be coded in any suitable computer readable programming language. In some embodiments, system control instructions 658 are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 658 may include input/output control (IOC) sequencing instructions for controlling the various parameters described above. For example, each phase of a deposition process or processes may include one or more instructions for execution by system controller 650. The instructions for setting process conditions for a film deposition process phase, for example, may be included in a corresponding deposition recipe phase. In some embodiments, the recipe phases may be sequentially arranged, so that all instructions for a process phase are executed concurrently with that process phase.

Other computer-readable instructions and/or programs stored on mass storage device 654 and/or memory device 656 associated with system controller 650 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal (see 508, FIG. 5) and to control the spacing between the substrate and other parts of process tool 500 of FIG. 5. The positioning program may include instructions for appropriately moving substrates in and out of the reaction chamber as necessary to deposit film on the substrates.

A process gas control program may include instructions for controlling gas composition and flow rates and optionally for flowing gas into the volumes surrounding one or more process stations prior to deposition in order to stabilize the pressure in these volumes. In some embodiments, the process gas control program may include instructions for introducing certain gases into the volume(s) surrounding the one or more process stations within a processing chamber during film deposition on substrates. The process gas control program may also include instructions to deliver these gases at the same rates, for the same durations, or at different rates and/or for different durations depending on the composition of the film being deposited. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates.

A heater control program may include instructions for controlling the current to a heating unit that is used to heat the substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates.

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during film deposition on the substrates.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas compositions and flow rates, temperatures (e.g., substrate holder and showerhead temperatures), pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of system controller 650 from various process tool sensors. The signals for controlling the processes may be output on the analog and/or digital output connections of process tool 600. Non-limiting examples of process tool sensors that may be monitored include mass flow controllers (MFCs), pressure sensors (such as manometers), temperature sensors such as thermocouples, etc. Appropriately programmed feedback and control algorithms may be used with data from these sensors to maintain process conditions.

System controller 650 may provide machine-readable instructions for implementing the above-described deposition processes. The instructions may control a variety of process parameters, such as DC power level, RF bias power level, pressure, temperature, etc. The instructions may control the parameters to perform film deposition operations as described herein.

Thus, the system controller will typically include one or more memory devices and one or more processors configured to execute machine-readable instructions so that the apparatus will perform operations in accordance with the processes disclosed herein. Machine-readable, non-transitory media containing instructions for controlling operations in accordance with the substrate processing operations disclosed herein may be coupled to the system controller.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Lithographic Patterning

Lithographic patterning of a film typically includes some or all of the following operations, each operation enabled with a number of possible tools: (1) application of photoresist on a substrate, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or substrate by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

Other Embodiments

Although the foregoing disclosed techniques, operations, processes, methods, systems, apparatuses, tools, films, chemistries, and compositions have been described in detail within the context of specific embodiments for the purpose of promoting clarity and understanding, it will be apparent to one of ordinary skill in the art that there are many alternative ways of implementing foregoing embodiments which are within the spirit and scope of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

The invention claimed is:

1. A method for depositing a SiN film having a reduced wet etch rate on a semiconductor substrate in a processing chamber, the method comprising:
   (a) adsorbing a film precursor onto a semiconductor substrate in a processing chamber such that the film precursor forms an adsorption-limited layer on the substrate, the film precursor comprising Si;
   (b) removing at least some unadsorbed film precursor from the volume surrounding the adsorbed film precursor;
   (c) after removing unadsorbed film precursor in (b), reacting the adsorbed film precursor by exposing it to a plasma comprising N-containing ions and/or radicals to form a SiN film layer on the substrate;
   (e) densifying the SiN film layer by exposing it to a plasma comprising He for between 0.5 and 15 seconds, the plasma comprising He having a power density relative to the substrate surface of between about 0.035 and 2.2 W/cm$^2$; and
   (g) repeating (a), (b), (c), and (e) to form another densified SiN film layer on the substrate.

2. The method of claim 1, further comprising:
   (d) removing at least some N-containing ions, N-containing radicals, desorbed film precursor, and/or reaction by-product from the volume surrounding the SiN film layer after the reacting in (c) and before the densifying in (e); and
   wherein (g) further comprises repeating (d).

3. The method of claim 2, further comprising:
   (f) removing at least some He from the volume surrounding the SiN film layer after the densifying in (e); and
   wherein (g) further comprises repeating (f).

4. The method of claim 1, wherein the film precursor further comprises one or more halogens.

5. The method of claim 1, wherein the film precursor further comprises two or more halogens.

6. The method of claim 1, wherein the film precursor is selected from: dichlorosilane, hexachlorodisilane, tetrachlorosilane, and the aminosilanes.

7. The method of claim 1, wherein the plasma comprising N-containing ions and/or radicals to which the adsorbed film precursor is exposed in (c) is formed by applying RF EM radiation to a N-containing plasma precursor selected from: $NH_3$, $N_2$, and the amines.

8. The method of claim 7, wherein the N-containing plasma precursor is selected from: $NH_3$ and t-butyl amine.

9. The method of claim 1, wherein the plasma comprising N-containing ions and/or radicals to which the adsorbed film precursor is exposed in (c) has a power density of between about 0.035 and 2.2 W/cm$^2$, and wherein the adsorbed film precursor is reacted in (c) by exposing it to said plasma for between about 0.1 and 6 sec.

10. The method of claim 9, wherein the ratio of the power density in (e) of the plasma comprising He to the power density in (c) of the plasma comprising N-containing ions and/or radicals is less than 1.

11. The method of claim 10, wherein the ratio of plasma exposure time in (e) to the plasma exposure time in (c) is greater than 1.

12. The method of claim 1, wherein the plasma comprising He to which the SiN layer is exposed in (e) has a power density of between about 0.070 and 0.28 W/cm$^2$, and wherein the SiN layer is densified in (e) by exposing it to said plasma for between about 4 and 8 seconds.

13. The method of claim 1, wherein the partial pressure of He in the volume surrounding the substrate during (e) is between about 2 and 6 torr.

14. The method of claim 1, wherein the temperature in the processing chamber during (a), (b), (c), and (e) is about or below 500° C.

15. The method of claim 1, wherein the deposited SiN film has a wet etch rate about or below 50 Å/minute when exposed to a 100:1 molar ratio HF solution at 23° C. and 760 torr.

16. The method of claim 15, wherein the semiconductor substrate has a feature having a top region and sidewalls within the feature, wherein the SiN film is deposited on the top region and on the sidewalls within the feature, and wherein the deposited SiN film has a wet etch rate on the top region and on the sidewalls within the feature of about or below 50 Å/minute when exposed to a 100:1 molar ratio HF solution at 23° C. and 760 torr.

17. An apparatus for depositing SiN films having reduced wet etch rates on semiconductor substrates, the apparatus comprising:
   a processing chamber;
   a substrate holder in the processing chamber;

one or more gas inlets for flowing gases into the processing chamber;

a vacuum source for removing gases from the processing chamber;

a plasma generator for generating plasmas within the processing chamber; and one or more controllers comprising machine-readable instructions for operating the one or more gas inlets, vacuum source, and plasma generator to deposit SiN film layers onto substrates, the instructions of the one or more controllers comprising instructions for:

(a) operating the one or more gas inlets to flow a film precursor into the processing chamber and adsorbing the film precursor onto a semiconductor substrate held in the substrate holder such that the film precursor forms an adsorption-limited layer on the substrate, the film precursor comprising Si;

(b) operating the vacuum source to remove at least some unadsorbed film precursor from the volume surrounding the adsorbed film precursor;

(c) after removing unadsorbed film precursor in (b), operating the plasma generator to generate a plasma comprising N-containing ions and/or radicals, and reacting the adsorbed film precursor by exposing it to said plasma to form a SiN film layer on the substrate;

(e) after reacting the adsorbed precursor in (c), operating the plasma generator to generate a plasma comprising He having a power density relative to the substrate surface of between about 0.035 and 2.2 W/cm$^2$, and densifying the SiN film layer by exposing it to said plasma for between 0.5 and 15 seconds; and (g) repeating (a), (b), (c), and (e) to form another densified SiN film layer on the substrate.

18. The apparatus of claim 17, wherein the instructions of the one or more controllers further comprise instructions for:

(d) operating the vacuum source to remove at least some N-containing ions, N-containing radicals, desorbed film precursor, and/or reaction by-product from the volume surrounding the SiN film layer after the reacting in (c) and before the densifying in (e); and wherein (g) further comprises repeating (d).

19. The apparatus of claim 18, wherein the instructions of the one or more controllers further comprise instructions for:

(f) operating the vacuum source to remove at least some He from the volume surrounding the SiN film layer after the densifying in (e); and wherein (g) further comprises repeating (f).

20. The apparatus of claim 17, wherein the plasma generator is operated such that the plasma comprising He to which the SiN layer is exposed in (e) has a power density of between about 0.070 and 0.28 W/cm$^2$, and wherein the SiN layer is densified in (e) by exposing it to said plasma for between about 4 and 8 seconds.

21. The apparatus of claim 17, wherein the one or more gas inlets and vacuum source are operated such that the partial pressure of He in the volume surrounding the substrate during (e) is between about 2 and 6 torr.

* * * * *